US011133153B2

(12) United States Patent
Iwaya et al.

(10) Patent No.: US 11,133,153 B2
(45) Date of Patent: Sep. 28, 2021

(54) ION MILLING DEVICE

(71) Applicant: HITACHI HIGH-TECHNOLOGIES CORPORATION, Tokyo (JP)

(72) Inventors: Toru Iwaya, Hitachinaka (JP); Hirobumi Muto, Hitachinaka (JP); Hisayuki Takasu, Oarai-machi (JP); Atsushi Kamino, Naka (JP); Asako Kaneko, Hitachinaka (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 142 days.

(21) Appl. No.: 16/012,423

(22) Filed: Jun. 19, 2018

(65) Prior Publication Data

US 2018/0301318 A1 Oct. 18, 2018

Related U.S. Application Data

(60) Continuation of application No. 15/011,980, filed on Feb. 1, 2016, now Pat. No. 10,008,365, which is a (Continued)

(30) Foreign Application Priority Data

Nov. 5, 2010 (JP) .................. 2010-248022

(51) Int. Cl.
*H01J 37/30* (2006.01)
*H01J 37/305* (2006.01)
(Continued)

(52) U.S. Cl.
CPC .......... *H01J 37/3053* (2013.01); *H01J 37/20* (2013.01); *H01J 37/304* (2013.01);
(Continued)

(58) Field of Classification Search
CPC .... H01J 37/20; H01J 37/3005; H01J 37/3007; H01J 37/304; H01J 37/3053;
(Continued)

(56) References Cited

U.S. PATENT DOCUMENTS 4,529,475 A 7/1985 Okano et al.
5,350,499 A 9/1994 Shibaike et al.
(Continued)

FOREIGN PATENT DOCUMENTS

DE 691 28 994 T2 7/1998
EP 0 476 479 A2 3/1992
(Continued)

OTHER PUBLICATIONS

Translation to Hiroshi (JP 2006-269342) published Oct. 2006.*
Machine Translation JP2009-245783 published Oct. 2009. (Year: 2009).*

Primary Examiner — Rodney G McDonald
(74) Attorney, Agent, or Firm — Volpe Koenig

(57) ABSTRACT

An ion milling device of the present invention is provided with a tilt stage (8) which is disposed in a vacuum chamber (15) and has a tilt axis parallel to a first axis orthogonal to an ion beam, a drive mechanism (9, 51) which has a rotation axis and a tilt axis parallel to a second axis orthogonal to the first axis and rotates or tilts a sample (3), and a switching unit which enables switching between a state in which the ion beam is applied while the sample is rotated or swung while the tilt stage is tilted, and a state in which the ion beams is applied while the tilt stage is brought into an untilted state and the sample is swung. Consequently, the ion milling device capable of performing cross-section processing and flat processing of the sample in the same vacuum chamber is implemented.

17 Claims, 20 Drawing Sheets

Related U.S. Application Data division of application No. 13/883,539, filed as application No. PCT/JP2011/075306 on Nov. 2, 2011, now abandoned.

(51) Int. Cl.
*H01J 37/20* (2006.01)
*H01J 37/304* (2006.01)

(52) U.S. Cl.
CPC ...... *H01J 37/3005* (2013.01); *H01J 37/3007* (2013.01); *H01J 2237/20207* (2013.01); *H01J 2237/20214* (2013.01); *H01J 2237/26* (2013.01)

(58) Field of Classification Search
CPC ... H01J 2237/20207; H01J 2237/20214; H01J 2237/26
USPC ........................................ 204/298.36, 192.34
See application file for complete search history.

(56) References Cited

U.S. PATENT DOCUMENTS

| | | | |
|---|---|---|---|
| 5,922,179 A * | 7/1999 | Mitro | C23C 14/022 204/192.11 |
| 7,150,811 B2 | 12/2006 | Miller | |
| 7,722,818 B2 | 5/2010 | Hasegawa et al. | |
| 2005/0118065 A1* | 6/2005 | Hasegawa | H01J 37/305 422/502 |
| 2005/0236587 A1 | 10/2005 | Kodama et al. | |
| 2007/0125958 A1* | 6/2007 | Tappel | H01J 37/20 250/441.11 |
| 2007/0227879 A1* | 10/2007 | Imamura | H01J 37/20 204/192.34 |
| 2008/0069453 A1 | 3/2008 | Abe et al. | |
| 2008/0202920 A1 | 8/2008 | Iwaya et al. | |
| 2010/0108506 A1* | 5/2010 | Nadeau | G11B 5/3163 204/298.32 |
| 2011/0226947 A1 | 9/2011 | Takahashi et al. | |

FOREIGN PATENT DOCUMENTS

| | | | |
|---|---|---|---|
| JP | 06-162975 A | | 6/1994 |
| JP | 06162975 A | * | 6/1994 |
| JP | 10-188873 A | | 7/1998 |
| JP | 2005-091094 A | | 4/2005 |
| JP | 2006-269342 A | | 10/2006 |
| JP | 2006269342 A | * | 10/2006 |
| JP | 2009-170117 A | | 7/2009 |
| JP | 2009-245783 A | | 10/2009 |

* cited by examiner

FIG.10
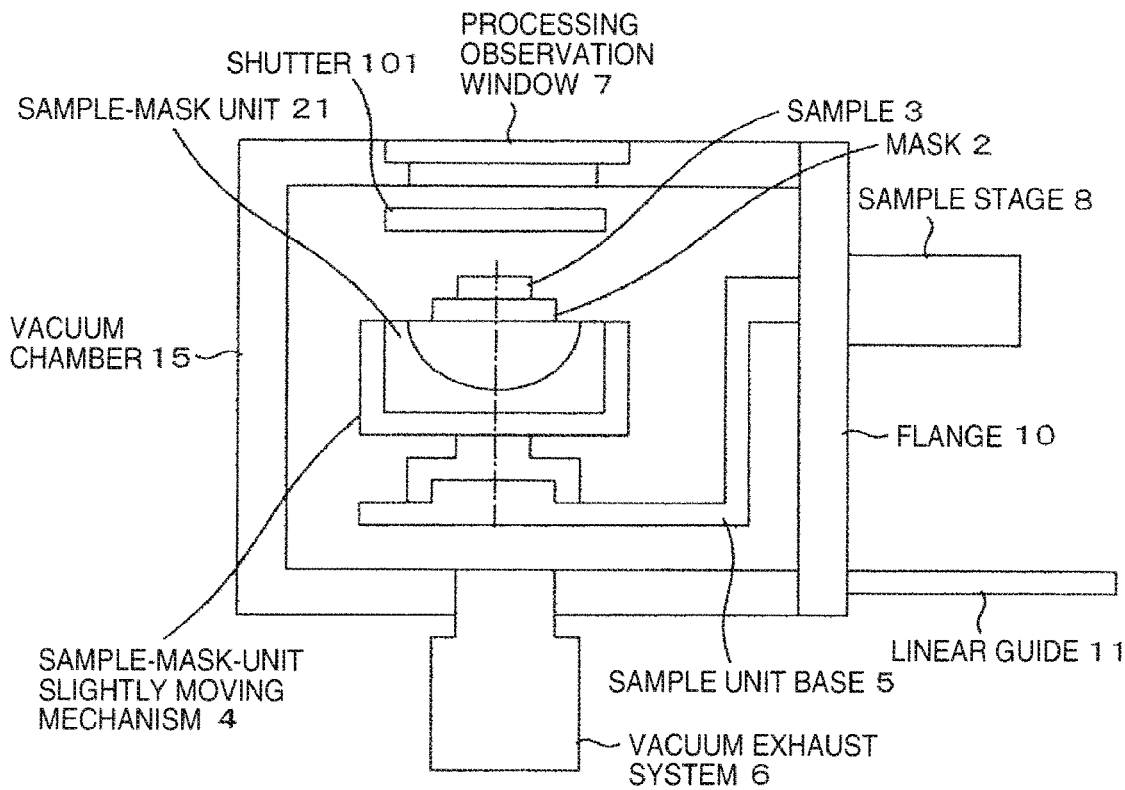
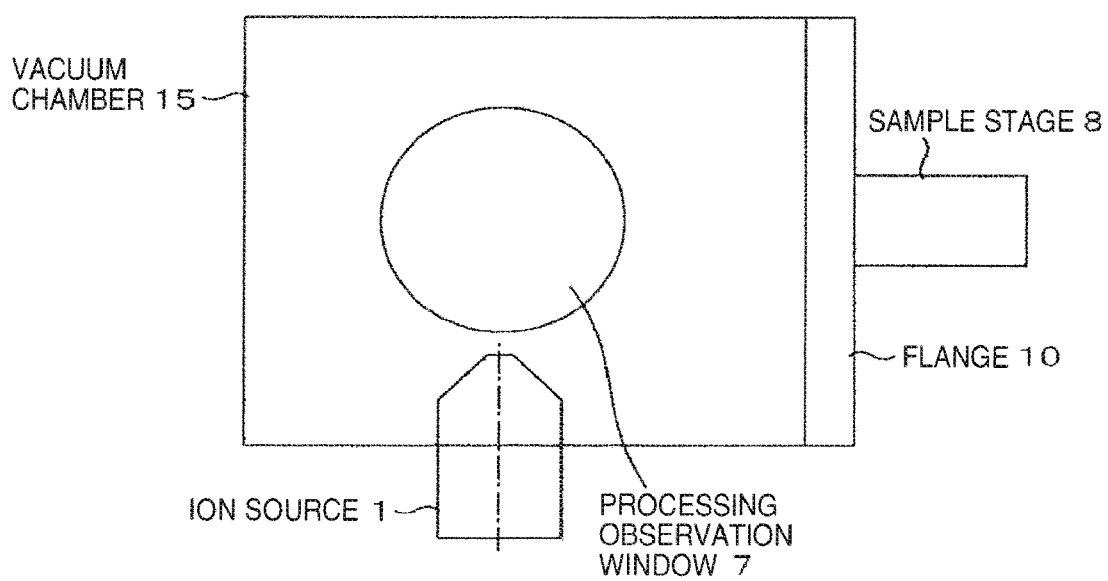

US 11,133,153 B2

ION MILLING DEVICE

CROSS-REFERENCE TO RELATED APPLICATION

This application is a continuation of U.S. patent application Ser. No. 15/011,980 filed on Feb. 1, 2016 and to U.S. patent application Ser. No. 13/883,539 filed on May 3, 2013 which claims priority to PCT/JP2011/075306 filed on Nov. 2, 2011 and claims priority under 35 U.S.C. § 119 of Japanese Patent Application No. 2010-248022, filed on Nov. 5, 2010, the entire content of which are herein incorporated by reference.

TECHNICAL FIELD

The present invention relates to an ion milling device and an ion milling method for fabricating a sample to be observed by using a scanning electron microscope (SEM), a transmission electron microscope (TEM), or the like.

BACKGROUND ART

An ion milling device is a device for polishing a surface or cross section of a metal, glass, ceramic, or the like by irradiating the surface or cross section with an argon ion beam, and is favorable as a pre-processing device for observation of a surface or cross section of a sample using an electron microscope.

In the conventional cross-sectional observation of a sample using an electron microscope, a vicinity of a part to be observed is first cut by using a diamond cutter, a jigsaw, or the like, for example. Then, after the cut surface is mechanically polished, the sample is placed on a sample table for an electron microscope and the image of the cut surface is observed.

The mechanical polishing has a problem that, when a soft sample such as of a polymer material or aluminum is polished, the surface to be observed is crushed or deeply scratched by particles of an abrasive compound. Moreover, the mechanical polishing also has problems that it is difficult to polish a hard sample such as of glass or a ceramic and that it is extremely difficult to perform cross-section processing on a composite material in which a soft material and a hard material are stacked.

On the other hand, ion milling has advantageous effects of being capable of processing a soft sample without crushing the profile of the surface, of being capable of polishing a hard sample and a composite material, and of being capable of easily obtaining a cross section in a mirror state.

Patent Literature 1 describes a sample fabricating device including: ion beam irradiating means, disposed in a vacuum chamber, for irradiating a sample with an ion beam; a tilt stage disposed in the vacuum chamber and having a tilt axis in a direction substantially perpendicular to the ion beam; a sample holder, disposed on the tilt stage, for holding the sample; and a shielding member, located on the tilt stage, for blocking part of the ion beam for irradiating the sample, the sample fabricating device being configured to process a sample with the ion beam while changing a tilt angle of the tilt stage.

CITATION LIST

Patent Literature

Patent Literature 1: JP-A-2005-91094

SUMMARY OF INVENTION

Technical Problem

The sample fabricating device disclosed in Patent Literature 1 is an ion milling device for cross-section processing (cross-section milling). Meanwhile, there is an ion milling device for flat surface milling, which processes a surface of a sample with an ion beam while rotating the sample. Although processing a sample by irradiating the sample with an ion beam in a similar manner as described above, these devices need to be used separately because of their different movements of a sample at the time of irradiation with an ion beam.

Hereinafter, an ion milling device intended to perform both cross-section processing and flat surface processing in the same vacuum chamber will be described.

Solution to Problem

As an aspect for achieving the above-described object, there is proposed an ion milling device including: an ion source for irradiating a sample with an ion beam; and a tilt stage disposed inside a vacuum chamber and having a tilt axis parallel with a first axis orthogonal to the ion beam, in which the ion milling device includes a support table, disposed on the tilt stage, for supporting a sample holding member for holding the sample; a drive mechanism for rotating or tilting the support table, the drive mechanism having a rotation axis and a tilt axis which are parallel with a second axis orthogonal to the first axis; and a switching unit for switching a state of the ion milling device between a state where the ion beam is irradiated while the tilt stage is tilted and the support table is rotated or swung and a state where the ion beam is irradiated while the tilt stage is not tilted and the support table is swung.

Advantageous Effect of Invention

According to the above-described configuration, it is possible to perform both of the cross-section milling and the flat surface milling with a single device.

Other objects, characteristics, and advantages of the present invention will be clarified from the following description of embodiments of the present invention regarding the attached drawings.

BRIEF DESCRIPTION OF DRAWINGS

FIG. 10 is a schematic configuration view of the ion milling device.

DESCRIPTION OF EMBODIMENTS

Figure 1:
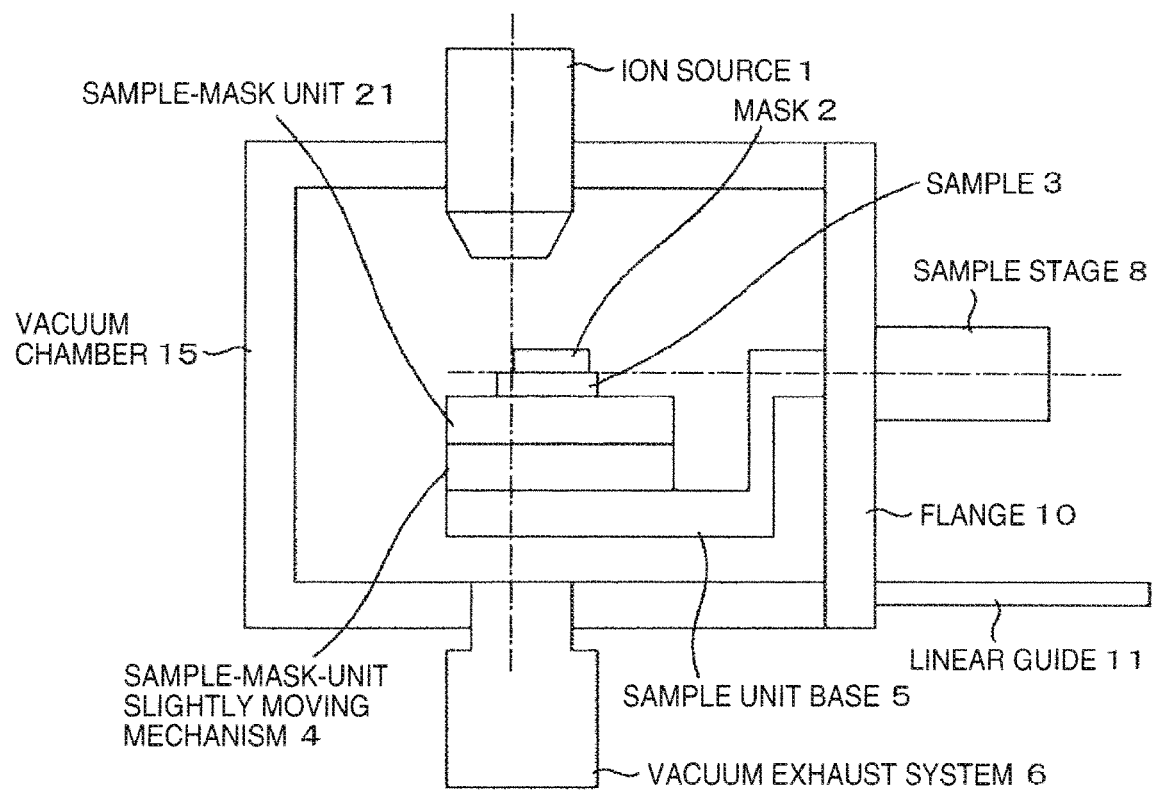
FIG. 1 is a schematic configuration view of an ion milling device.

In a cross-section milling device (device for forming a smooth surface in a sample by milling the sample via a mask), a sample stage and a unit for holding a sample are placed on the same rotation tilt axis (which means they have the same movement). For this reason, a processing observation window is placed on the same axial direction as that of the sample stage. Accordingly, when the sample stage is located on a front surface of the device, the processing observation window is located on the front surface or a rear surface of the device, which makes it difficult to place and operate an observation device (microscope). In addition, flat surface milling (which smoothly flattens a surface perpendicular to an axis of an ion beam (which means the tilt angle of the sample stage is 90 degrees)) cannot be enabled by only replacing a rotating and tilting mechanism of the cross-section milling device with a rotating mechanism; accordingly milling devices respectively for cross-section and flat surface milling are required.

In this embodiment, description will be given of an ion milling device characterized in that it facilitates observation of an observation surface processed mainly by milling and further of performing both of the cross-section milling and the flat surface milling.

In this embodiment, as an example of the ion milling device, description will be given of an ion milling device including: an ion beam source, attached to a vacuum chamber, for irradiating a sample with an ion beam; a sample-mask unit including a sample holder for fixing the sample, a mask (shielding part) for shielding part of the sample fixed to the sample holder, a sample rotating mechanism for rotating the sample holder, and a mask position adjusting unit for adjusting a shielding positional relation between the mask and the sample; a sample-mask-unit slightly moving mechanism capable of driving the sample-mask unit in the X-axis and Y-axis directions perpendicular to the ion beam; a sample unit base capable of placing the sample-mask-unit slightly moving mechanism in the vacuum chamber; and an optical microscope for observing the shielding positional relation between the mask and the sample, characterized in that a fixation part of the sample-mask unit or the sample-mask-unit slightly moving mechanism to be fixed to the sample unit base is a rear portion of the sample-mask unit or the sample-mask-unit slightly moving mechanism, a rotation part is provided on the sample unit base, the sample stage, the ion beam source, and the processing observation window are mounted respectively on a front surface, a right or left side surface, and an upper surface of the vacuum chamber, and a shutter is provided between the sample and the processing observation window.

In addition, description will be given of the ion milling device characterized in that the rotating and tilting mechanism for the sample includes a rotating function, the ion milling device includes a tilting mechanism having a tilt axis in a direction perpendicular to a rotation axis of the sample, and a center displacing mechanism for the axis of the ion beam and the rotation axis of the sample (in the case where the tilt angle of the stage is 90 degrees) is provided.

The above-described configuration facilitates the observation of an observation surface processed by milling and makes it possible to perform both of the cross-section milling and the flat surface milling.

Hereinafter, the embodiment will be described on the basis of the drawings.

This embodiment will be described by giving as an example an ion milling device equipped with an ion source for irradiation with an argon ion beam. However, the ion beam is not limited to the argon ion beam and various types of ion beams are applicable.

FIG. 1 shows a configuration of the ion milling device. An ion source 1 and a sample stage 8 are provided on an upper surface and a front surface of a vacuum chamber 15, respectively.

A sample-mask-unit slightly moving mechanism 4 is mounted on a sample unit base 5. The mounting method is to cause a lower surface (on the opposite side to a mask surface to be irradiated with the ion beam) of the sample-mask-unit slightly moving mechanism 4 and an upper surface of the sample unit base 5 to come into contact with each other, and be screwed. The sample unit base 5 is configured to be rotatable and tiltable at any angle to the optical axis of the ion beam. The direction and tilt angle of the rotation and tilt of the sample unit base 5 is controlled by the sample stage 8. Rotating and tilting the sample stage 8 allows a sample 3 placed on the sample-mask-unit slightly moving mechanism 4 to be set at a predetermined angle to the optical axis of the ion beam. Moreover, the rotation tilt axis of the sample stage 8 and the upper surface of the sample (lower surface of the mask) are positioned at the same level, thereby forming an efficient and smooth processing plane. In addition, the sample-mask-unit slightly moving mechanism 4 is configured to be movable to the front, rear, left, and right in directions perpendicular to the optical axis of the ion beam, that is, in the X direction and the Y direction.

The sample unit base 5 is disposed via the sample stage 8 (rotating mechanism) mounted on a flange 10 serving part of a container wall of the vacuum chamber 15. The sample unit base 5 is configured to be pulled out of the vacuum chamber when the vacuum chamber 15 is opened into an atmospheric state by pulling out the flange 10 along a linear guide 11. In this way, a sample-stage pulling out mechanism is configured.

Figure 2:
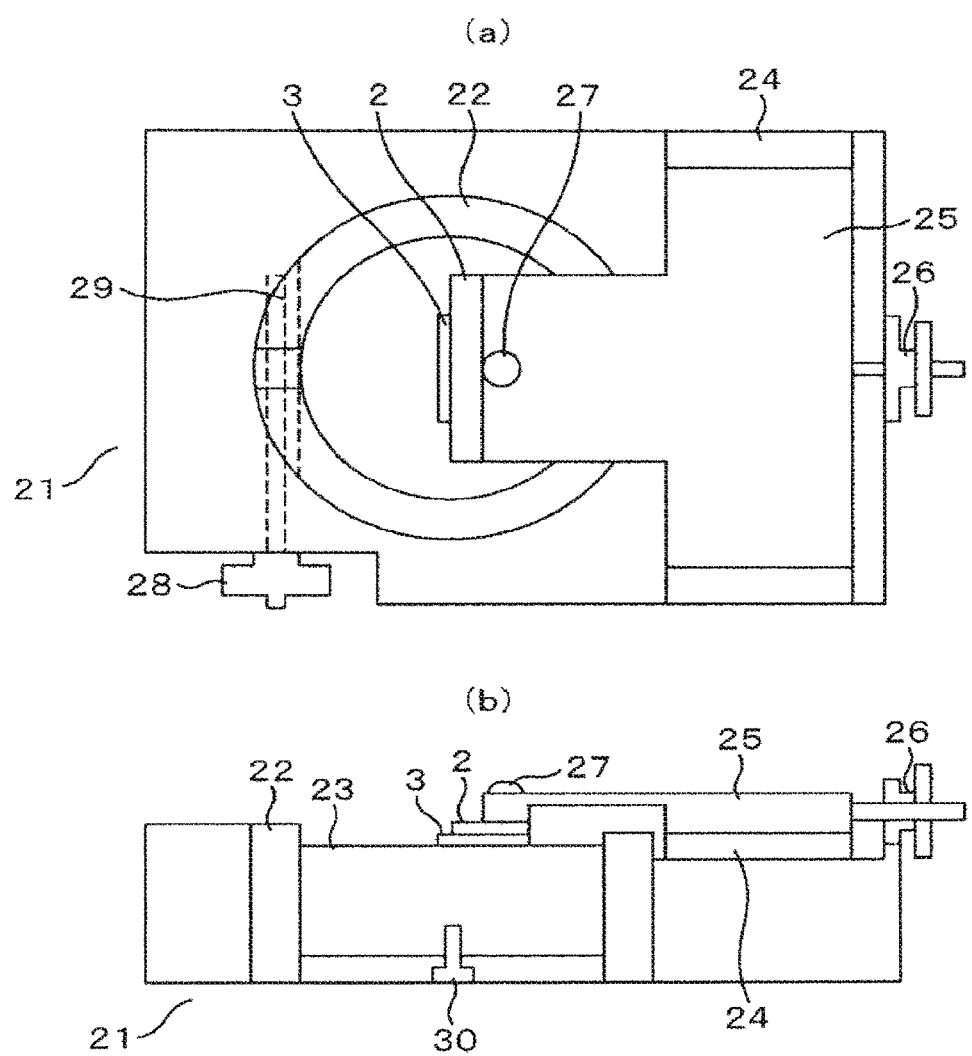
FIG. 2 is a schematic configuration view of a sample-mask unit.

A main body of a sample-mask unit 21 will be described on the basis of FIG. 2. Part (a) and Part (b) of FIG. 2 are a plan view and a side view, respectively. In the embodiment, a main body configured integrally of at least a sample holder 23, the rotating mechanism for the sample holder 23, a mask 2, and a finely adjusting mechanism for the mask 2 is referred to as the sample-mask unit (main body) 21. In FIG. 2, a sample-holder rotary ring 22 and a sample-holder rotary screw 28 are included as the rotating mechanism for the sample holder 23, so that the sample holder is rotatable vertically with respect to the optical axis of the ion beam. The sample-holder rotary ring 22 is configured to be rotated by rotating the sample-holder rotary screw 28, and to be reversely rotated back by a spring pressure of a spring 29.

The sample-mask unit 21 has a mechanism capable of finely adjusting the position and rotation angle of the mask, and is attachable to and detachable from the sample-mask-unit slightly moving mechanism 4. In this embodiment, the sample-mask unit 21 and the sample-mask-unit slightly moving mechanism 4 are two components, but may be configured as a single component (In the embodiment, the sample-mask unit and the sample-mask-unit slightly moving mechanism are described separately for the sake of understanding).

The mask 2 is fixed to a mask holder 25 with a mask fixing screw 27. The mask holder 25 is moved along a linear guide 24 by operating a mask finely adjusting mechanism (that is, a mask position adjusting unit) 26, so that the positions of the sample 3 and the mask 2 are finely adjusted. The sample holder 23 is inserted into and fixed to the sample-holder rotary ring 22 from a lower side. The sample 3 is bonded and fixed to the sample holder 23. The position of the sample holder 23 in a height direction is adjusted with a sample-holder-position controlling mechanism 30, thereby bring the sample holder 23 into close contact with the mask 2.

Figure 3:
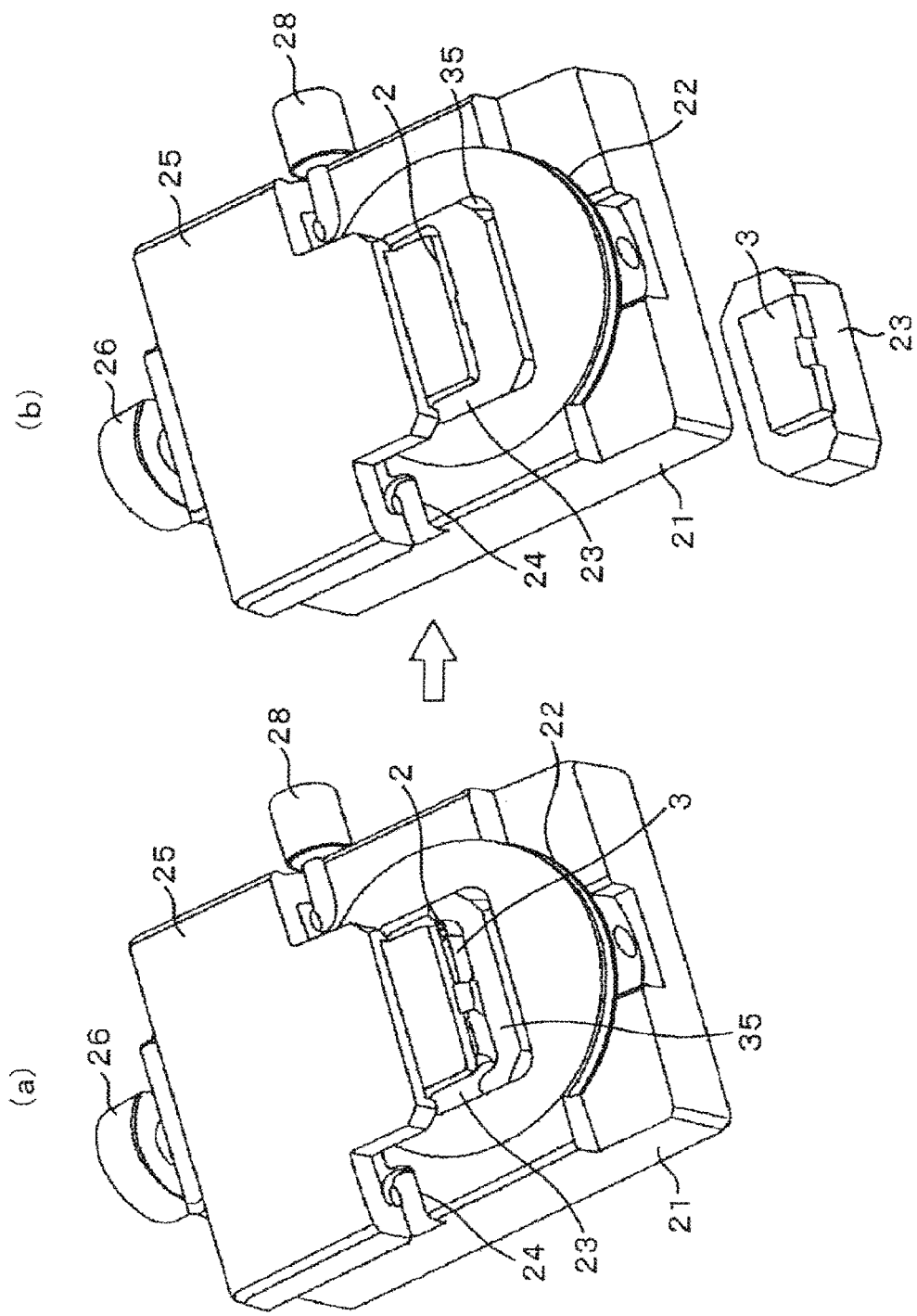
FIG. 3 is a view showing another example of the sample-mask unit.

FIG. 3 shows another example of the sample-mask unit 21. This example uses a sample-holder fixing metal fitting 35 and the other configurations are basically the same as those of the example shown in FIG. 2. Part (a) of FIG. 3 shows a state where the sample holder 23 to which the sample 3 is fixed is mounted in the sample-mask unit 21 while Part (b) of FIG. 3 shows a state where the sample holder 23 to which the sample 3 is fixed is removed out of the sample-mask unit 21.

Figure 4:
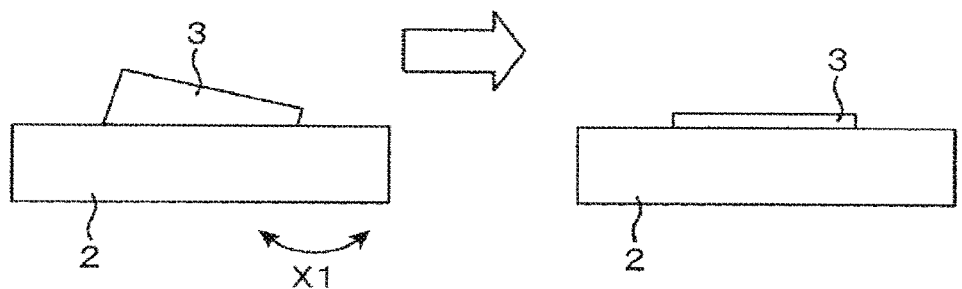
FIG. 4 is an explanatory view showing a method of placing a cross section of a sample and a mask in parallel with each other.

FIG. 4 is an explanatory view showing a method of placing a cross section of the sample and the mask in parallel with each other. The sample-holder rotary screw 28 is rotated to perform position adjustment in an X1 direction, followed by performing fine adjustment under the microscope as described later to place the cross section of the sample 3 and the ridge line of the mask 2 in parallel with each other. In this event, the setting is performed by rotating the mask finely adjusting mechanism 26 such that the cross section of the sample 3 slightly protrudes, for example protrudes by approximately 50 µm, from the mask.

Figure 5:
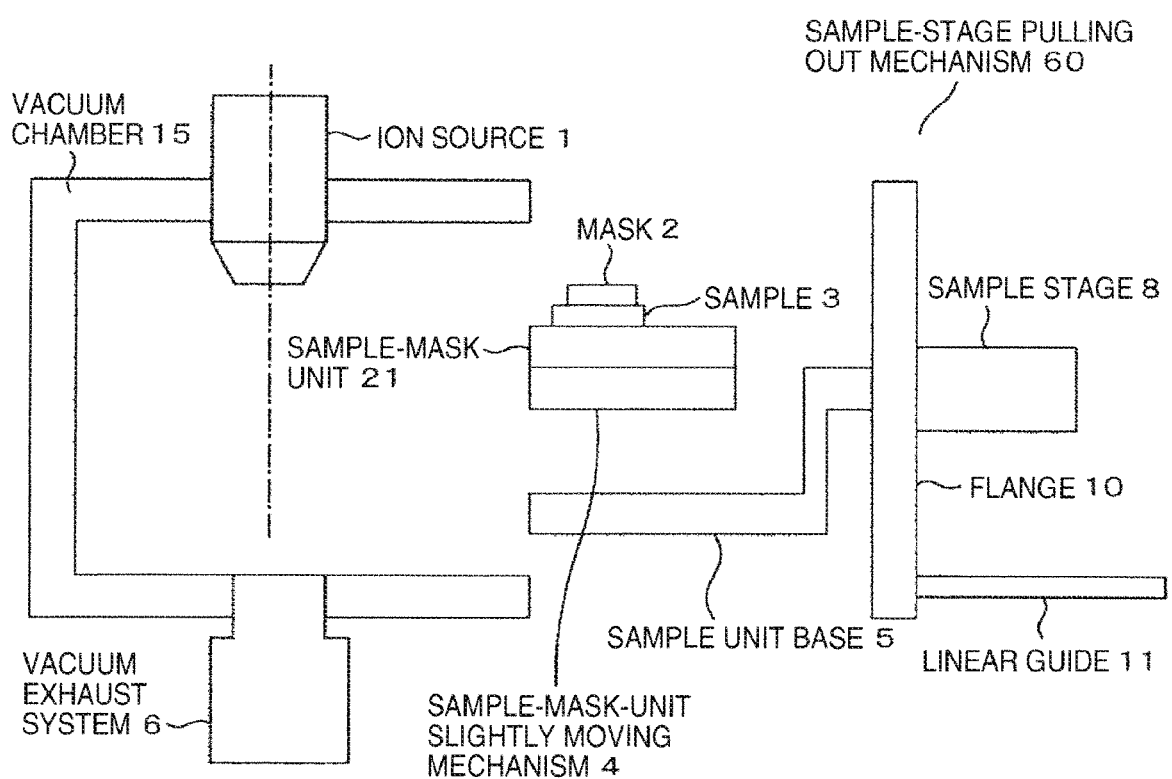
FIG. 5 is a view showing a state where the sample unit base is pulled out and a sample-mask-unit slightly moving mechanism on which the sample-mask unit is placed has been detached.

FIG. 5 shows a configuration of a sample-stage pulling out mechanism 60. The sample-stage pulling out mechanism 60 includes the linear guide 11 and the flange 10 fixedly attached to the linear guide 11. The sample unit base 5 fixedly attached to the sample stage mounted on the flange 10 is pulled out of the vacuum chamber 15 along the linear guide 11. In conjunction with this operation, the sample-mask-unit slightly moving mechanism 4 with the sample-mask unit 21 is placed is placed on the sample unit base 5, in other words, the mask 2, the sample holder 23, and the sample 3 are integrally pulled out of the vacuum chamber 15.

In the embodiment, the sample-mask-unit slightly moving mechanism 4, on which the sample-mask unit 21 is placed, has such a configuration as to be detachably fixed to the sample unit base 5. Accordingly, once the sample-mask-unit slightly moving mechanism 4, on which the sample-mask unit 21 is placed, is pulled out of the vacuum chamber 15, the sample-mask-unit slightly moving mechanism 4, on which the sample-mask unit 21 is placed, is made detachable from the sample unit base 5 (detachment standby of the sample-mask unit 21).

FIG. 5 shows a state where the sample-mask-unit slightly moving mechanism 4, on which the sample-mask unit 21 is placed, has been detached from such a detachable state. This detachment is performed manually or with an appropriate tool.

Figure 6:
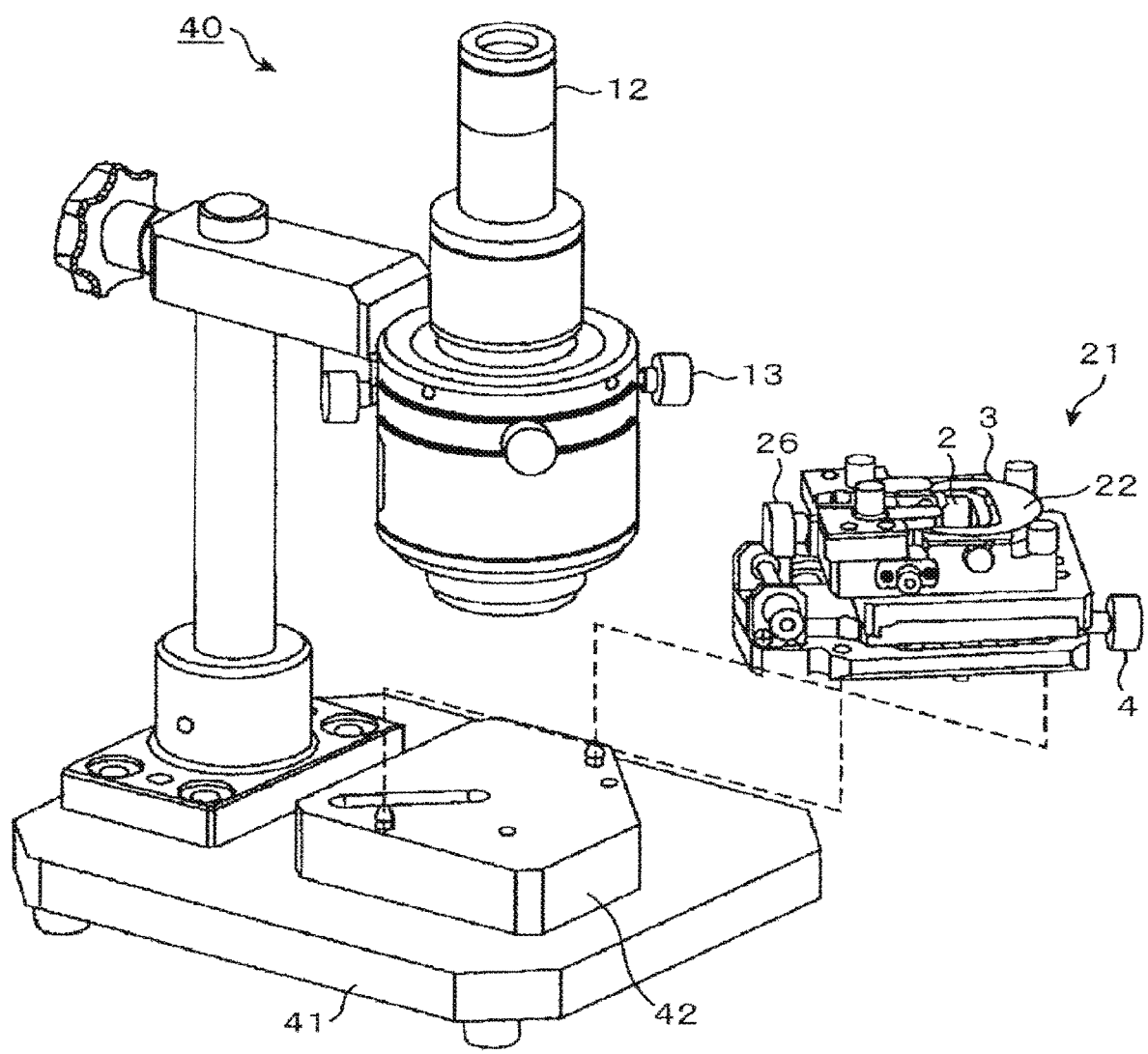
FIG. 6 is a view showing how a sample-mask-unit slightly moving mechanism on which a sample-mask unit is placed is mounted on a separately provided optical microscope.

On the other hand, an optical microscope 40 for observing the shielding positional relation between the mask 2 and the sample 3 is configured as a separate body from the vacuum chamber 15 as shown in FIG. 6, and can be disposed at any position. In addition, the optical microscope 40 includes a known magnifying lens 12 and a magnifying-lens slightly moving mechanism 13. Further, the optical microscope 40 is provided with a fixation table 42 on an observation table 41 such that the detached sample-mask-unit slightly moving mechanism 4, on which the sample-mask unit 21 is placed, can be placed on the fixation table 42. The sample-mask-unit slightly moving mechanism 4, on which the sample-mask unit 21 is placed, is placed on the fixation table 42 at a determined position that is reproducible by shafts and holes for positioning.

Figure 7:
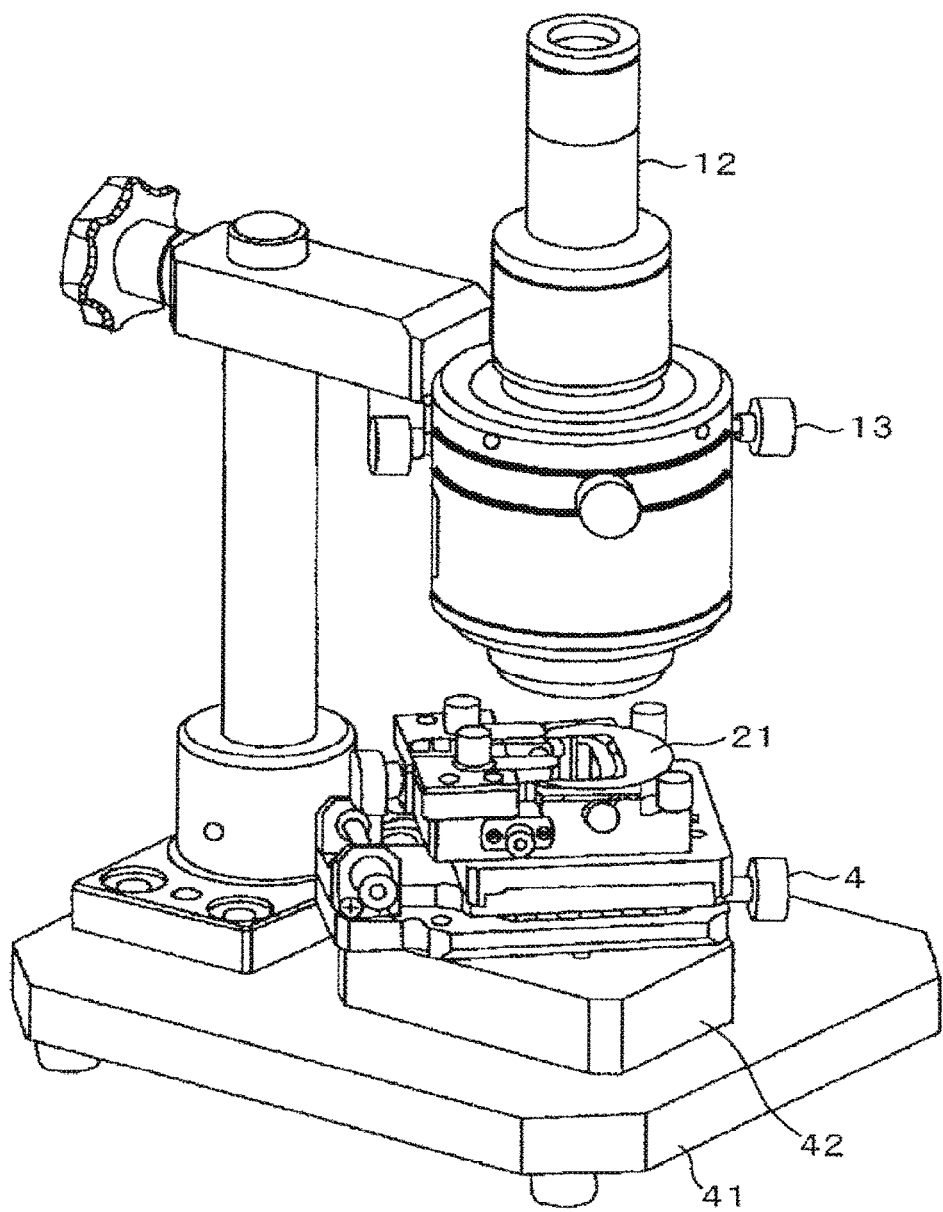
FIG. 7 a view showing a state where the sample-mask-unit slightly moving mechanism on which the sample-mask unit is placed is mounted on the optical microscope.

FIG. 7 shows a state where the sample-mask-unit slightly moving mechanism 4, on which the sample-mask unit 21 is placed, is fixed on the fixation table 42.

Figure 8:
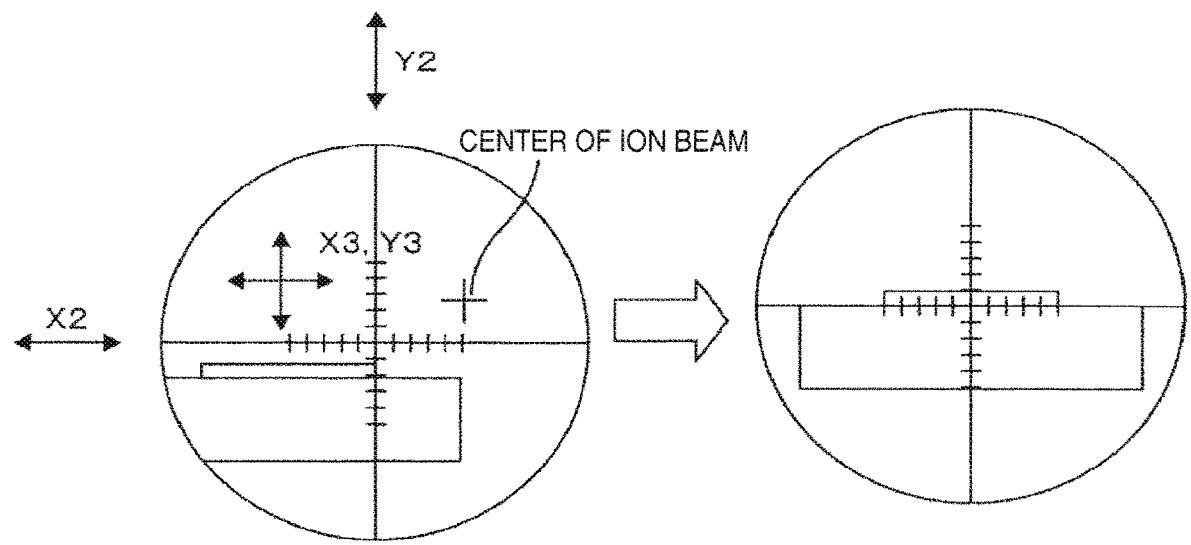
FIG. 8 is an explanatory view showing a method of aligning the center of an argon ion beam and a portion of the sample to be subjected to cross-section polishing.

FIG. 8 is an explanatory view showing a method of aligning a portion of the sample 3 desired to be subjected to cross-sectional polishing with the center of the ion beam. A mark formed by irradiation with the ion beam with a photosensitive paper or the like being attached to the sample holder 23, that is, the center of the beam and the center of the magnifying lens are aligned with each other by driving the magnifying lens in the X2 and Y2 directions by the magnifying-lens slightly moving mechanism 13. The sample-mask-unit slightly moving mechanism 4, on which the sample-mask unit main body 21 loaded with the sample 3 as shown in FIG. 3 is placed, is placed on the fixation table 42. The position of the fixation table 42 in the X3 and Y3 directions is adjusted to be aligned with the center of the magnifying lens, thereby aligning the center of the ion beam with the portion desired to be subjected to cross-sectional polishing.

As described above, when the shielding positional relation between the mask 2 and the sample 3 is adjusted, the sample-mask-unit slightly moving mechanism 4, on which the sample-mask unit 21 is placed, is detached from the sample unit base 5 and mounted on the fixation table 42 of the optical microscope 40, and the shielding positional relation of the mask 2 relative to the sample 3 is adjusted by the mask position adjusting unit (mask finely adjusting mechanism).

Figure 9:
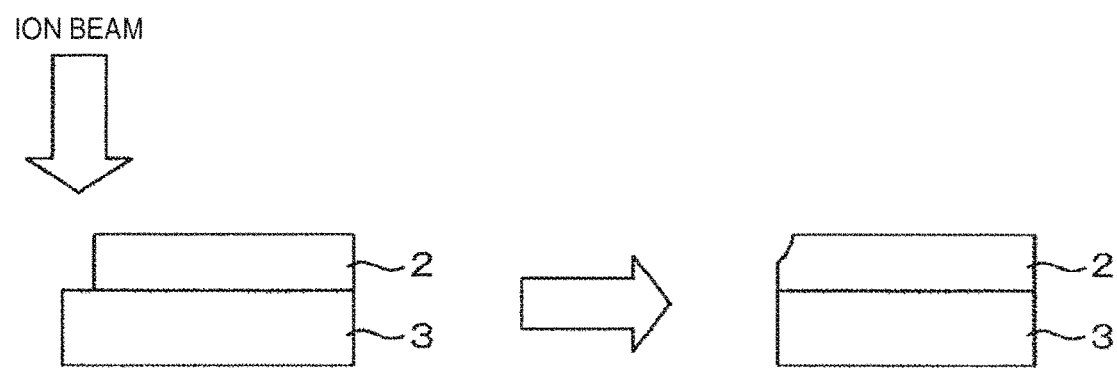
FIG. 9 is an explanatory view showing a method of polishing a cross section of a sample by ion milling.

FIG. 9 is an explanatory view showing a method of mirror-polishing the cross section of the sample 3 with the ion beam. Irradiating the sample 3 with an argon ion beam can remove a portion of the sample 3 not covered with the mask 2 along the mask 2 in a depth direction and can mirror-polish the surface of the cross section of the sample 3.

In this way, the sample-mask-unit slightly moving mechanism 4, on which the sample-mask unit 21 including the mask 2 having the adjusted shielding positional relation relative to the sample is placed, is returned to and mounted on the sample unit base 5 at the time of the ion milling.

As described above, an ion milling method is configured, in which at the time of adjusting the shielding positional relation between the mask 2 and the sample 3, the sample-mask-unit slightly moving mechanism 4 on which the sample-mask unit 21 is placed is removed from the sample unit base 5 and mounted on the fixation table 42 of the optical microscope 40 and the shielding positional relation of the mask relative to the sample 3 is adjusted, and at the time of ion milling, the sample-mask-unit slightly moving mechanism 4, on which the sample-mask unit 21 including the mask 2 having the adjusted shielding positional relation relative to the sample is placed, is returned into the vacuum chamber 15 and mounted on the sample unit base 5.

The ion milling device as illustrated in FIG. 1 can perform the cross-section milling processing but cannot perform the flat surface milling processing. For this reason, in this embodiment, an ion milling device capable of both types of processing will be described.

FIG. 10 shows a configuration of an ion milling device that can perform both of the cross-section milling processing and the flat surface milling processing. A processing observation window 7, an ion source, and a sample stage are mounted respectively on an upper surface, a left side surface (may alternatively be a right side surface), and a front surface of a vacuum chamber 15, and a shutter 101 is provided between a sample and the processing observation window 7. The shutter 101 is provided to prevent sputtered particles from being deposited on the processing observation window 7. The vacuum chamber 15 generally has a box shape forming a space to form a vacuum atmosphere or a shape similar to the box shape. The observation window is provided above the box (in a direction opposite to that in which the gravitational field is directed in an environment with gravity) while the ion source is provided on a side wall surface of the box (a surface adjacent to the upper surface of the box and in a direction perpendicular to the direction in which the gravitational field is directed). In other words, the processing observation window is provided on the wall surface of the vacuum chamber in a direction orthogonal to a plane including the tilt axis of the sample stage and the irradiation path of the ion beam. Note that an optical microscope or an electron microscope may be provided in an opening for the processing observation window instead of providing a window capable of being vacuum-sealed, as will be described later.

Figure 11:
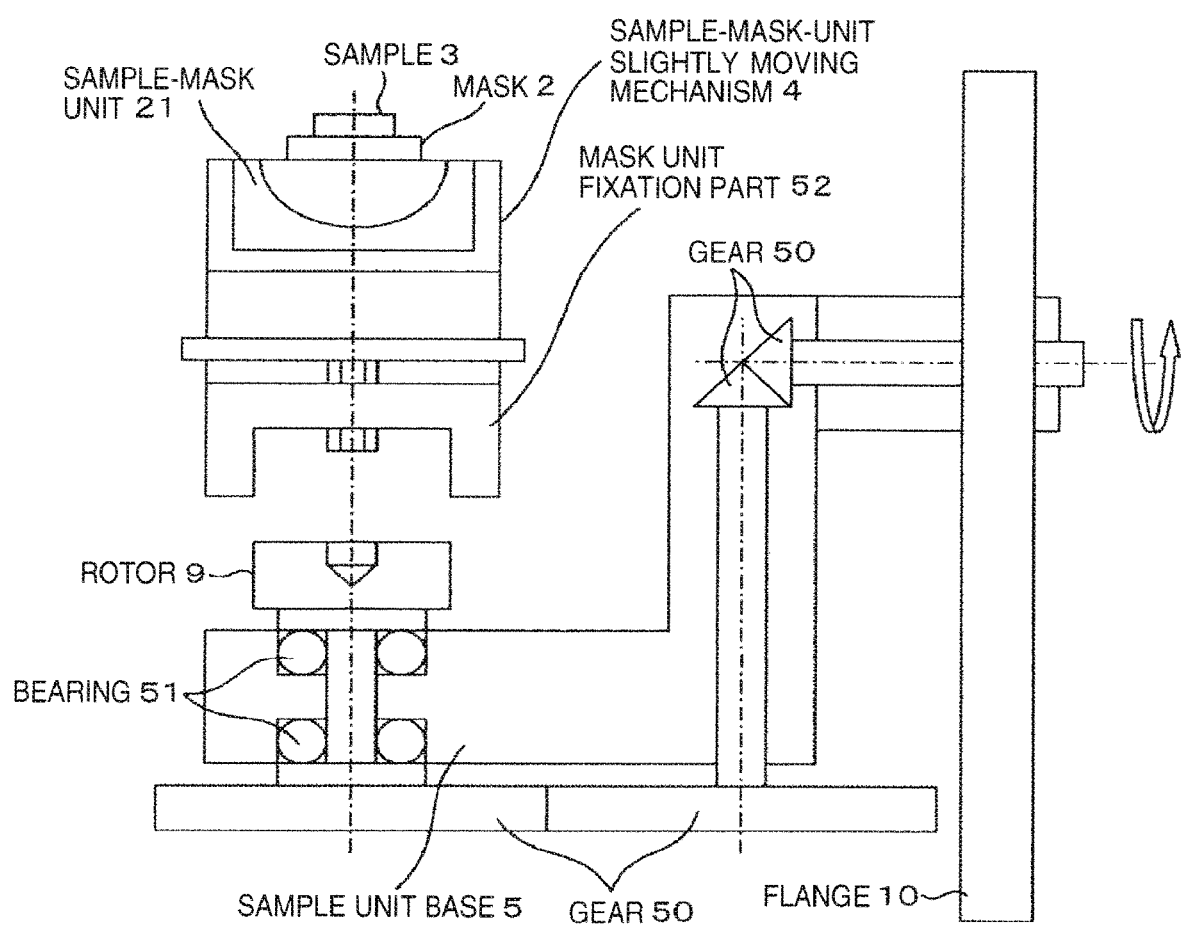
FIG. 11 is a configuration view of the sample-mask-unit slightly moving mechanism on which the sample-mask unit is placed and the sample unit base.

The sample unit base 5 is provided with a rotor 9 on which a sample holding member (member for holding a sample including the sample-mask-unit slightly moving mechanism 4) can be mounted. The rotor 9 functions as a support table for supporting the sample holding member. As shown in FIG. 11, the sample unit base 5 is formed of the rotor 9, gears 50, and bearings 51. As shown in FIG. 11, the sample-mask-unit slightly moving mechanism 4 has a mask unit fixation part (including a screw) 52 provided on a rear surface of the sample-mask-unit slightly moving mechanism 4. A method of mounting the sample-mask-unit slightly moving mechanism 4 onto the sample unit base 5 is to cause a fixation surface (rear surface) of the sample-mask-unit slightly moving mechanism 4 and an upper surface of the rotor 9 of the sample unit base 5 to come into contact with each other, and be screwed by using the mask unit fixation part 52. The sample unit base 5 is not rotated or tilted, and configured such that the rotor 9 mounted on the sample unit base 5 enables rotation and tilt at any angle to the optical axis of the ion beam irradiated from the side surface of the vacuum chamber 15. The direction and tilt angle of the rotation and tilt are controlled by the sample stage 8.

Figure 12:
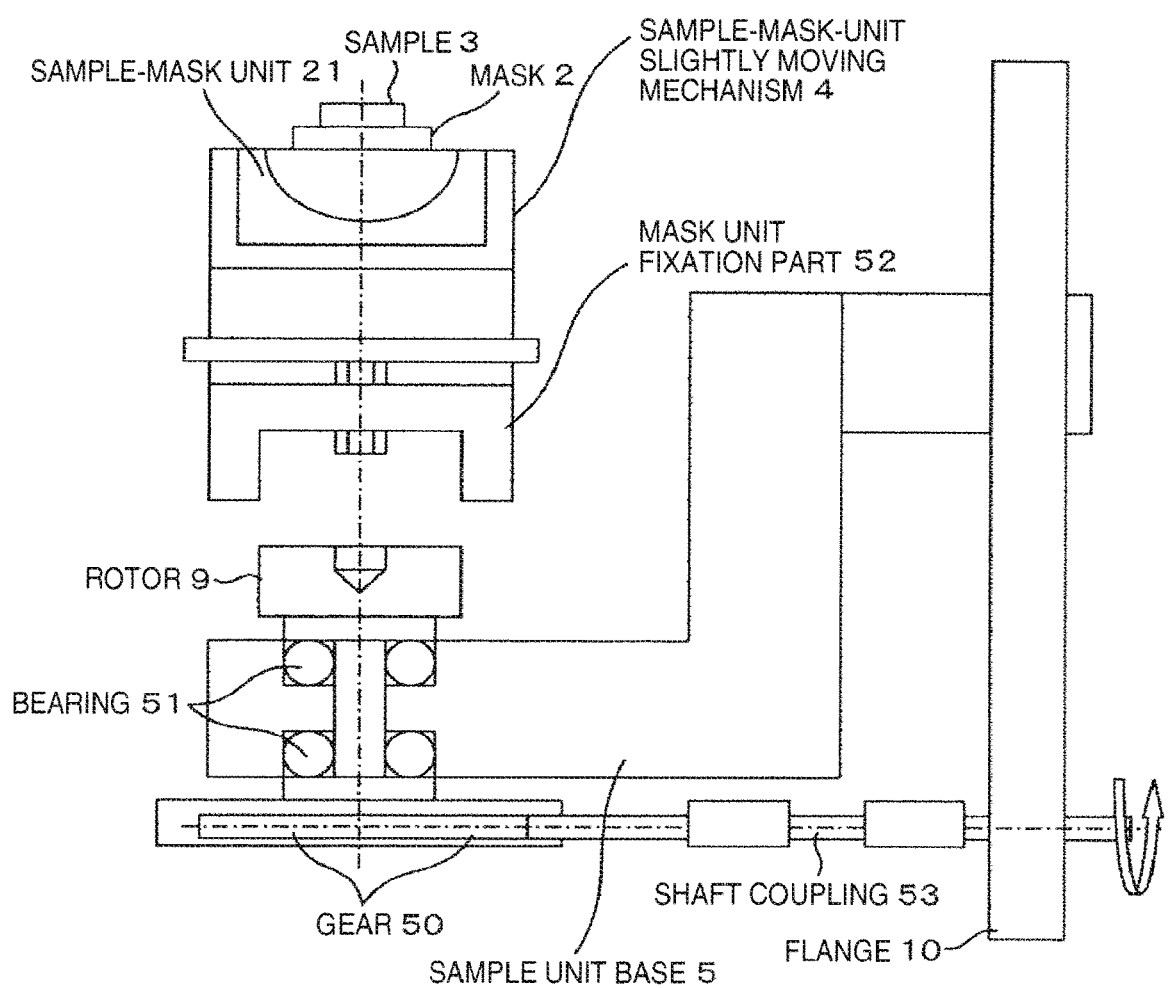
FIG. 12 is a configuration view of the sample-mask-unit slightly moving mechanism on which the sample-mask unit is placed and a sample unit base using a shaft coupling.

Here, the method of rotating and tilting the rotor 9 of the sample unit base 5 may be either one shown in FIG. 11 or one (using a shaft coupling 53 shown in FIG. 12. Rotating and tilting the rotor 9 of the sample unit base 5 can set the sample 3 placed on the sample-mask-unit slightly moving mechanism 4 at a predetermined angle to the optical axis of the ion beam. Further, the rotation axis of the rotor 9 of the sample unit base 5 and the upper surface of the sample (the lower surface of the mask) are positioned at the same level, thereby forming an efficient and smooth processing plane. In addition, the sample-mask-unit slightly moving mechanism 4 is configured to be movable to the front, rear, left, and right in a direction perpendicular to the optical axis of the ion beam, that is, in the X direction and the Y direction.

Figure 13:
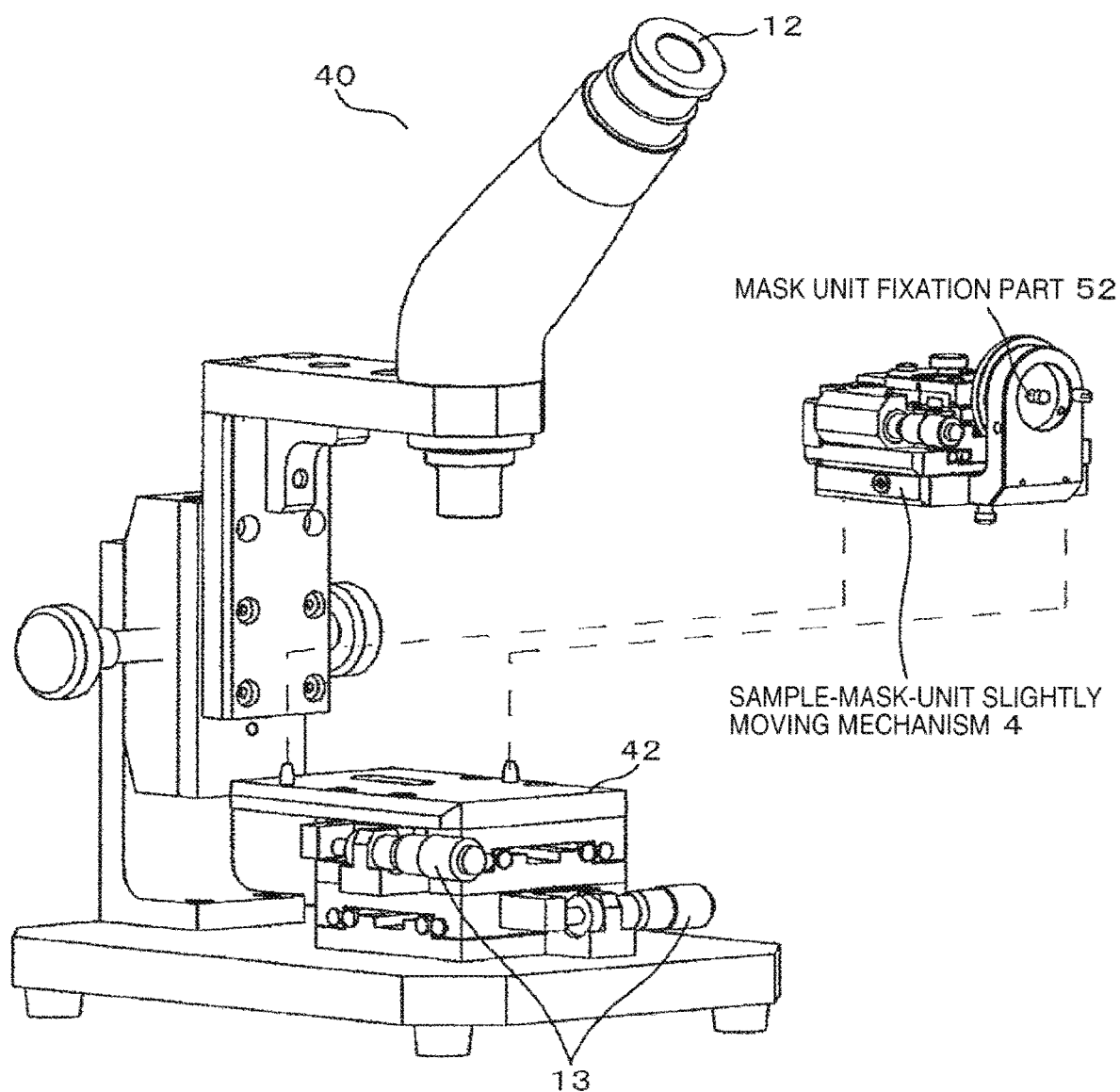
FIG. 13 is a view showing how the sample-mask-unit slightly moving mechanism on which the sample-mask unit is placed is mounted on a separately provided optical microscope.

The placement onto the optical microscope 40, which is a separate body from the device, may be achieved by a method using a lower surface of the sample-mask-unit slightly moving mechanism 4, instead of using the mask unit fixation part 52 of the sample-mask unit 21 or the sample-mask-unit slightly moving mechanism 4, which is used for the placement onto the sample unit base 5 as shown in FIG. 13.

The point different from the example of FIG. 6 is that the magnifying-lens slightly moving mechanism 13 for adjusting the center of the beam and the center of the magnifying lens is implemented on the fixation table 42 side. Either of this example or the example of FIG. 6 may be employed for the magnifying-lens slightly moving mechanism 13. The other operations are performed in the same manner as those of FIG. 6.

Figure 14:
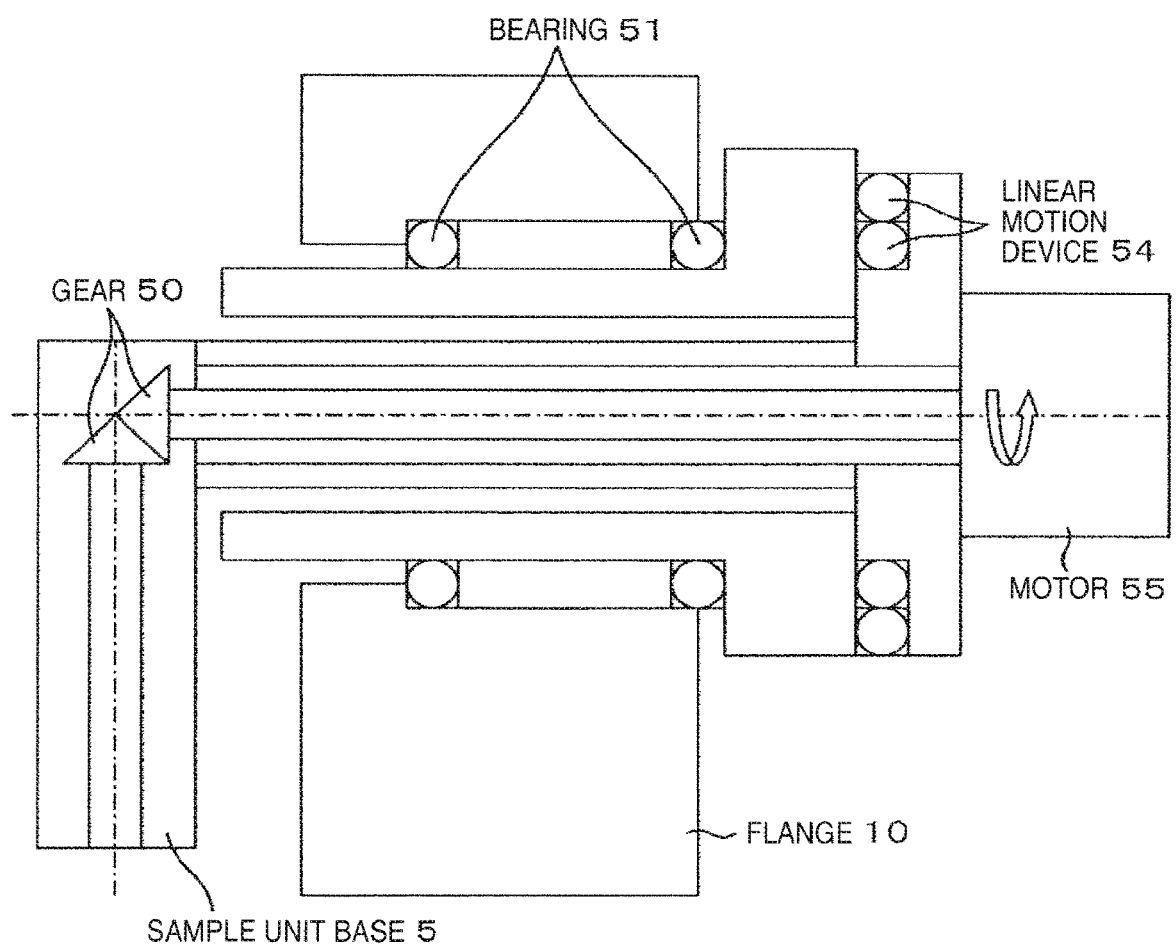
FIG. 14 is a configuration view of a rotating and tilting mechanism and a center displacing mechanism.
Figure 15:
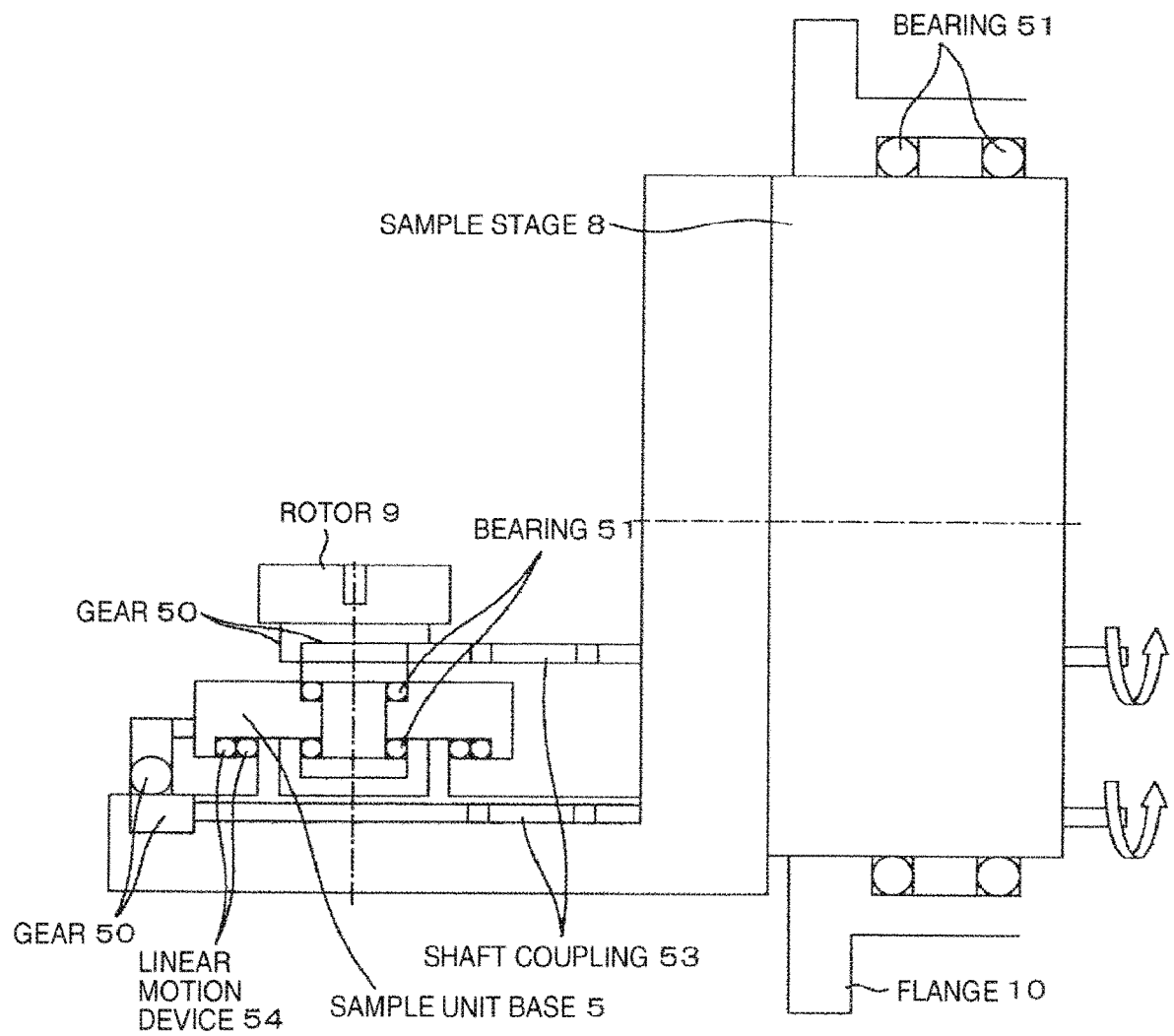
FIG. 15 is a configuration view of a rotating and tilting mechanism and a center displacing mechanism (using a shaft coupling).
Figure 16:
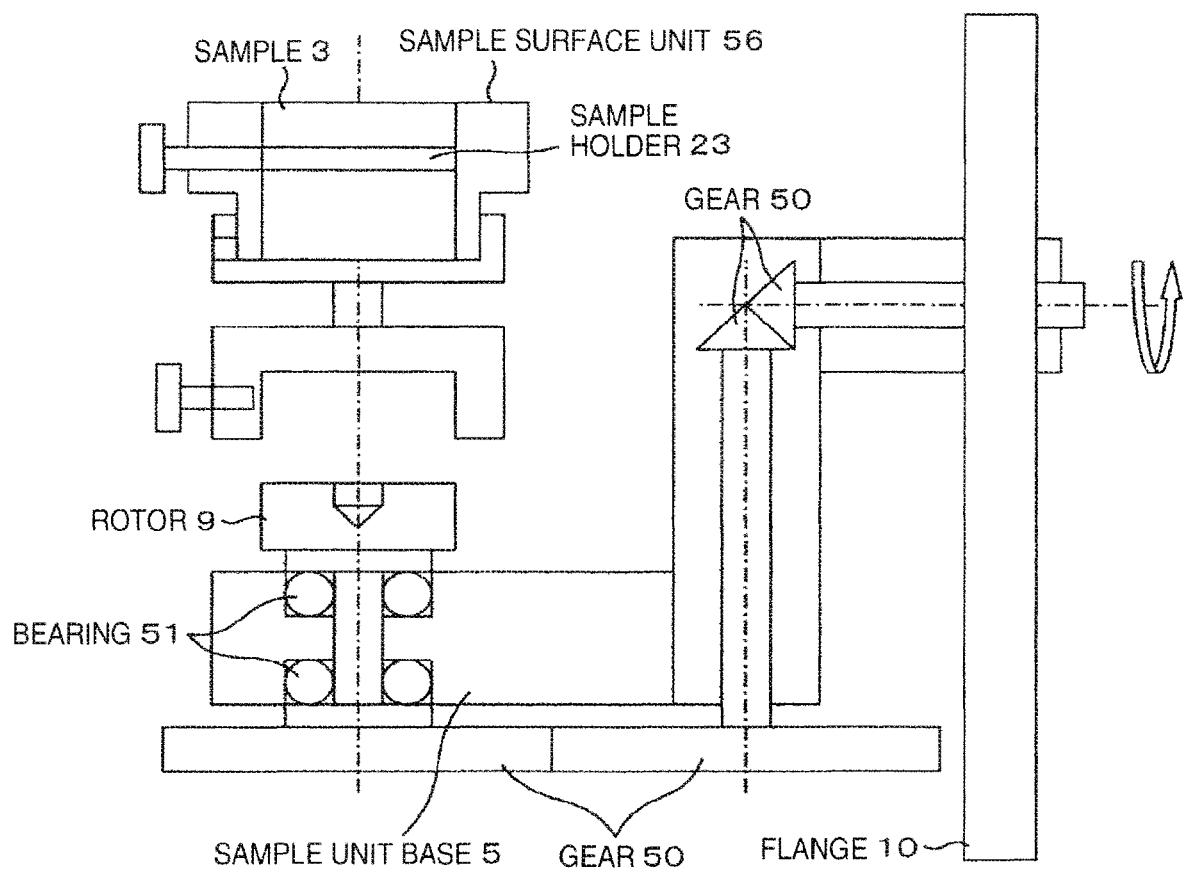
FIG. 16 is a configuration view of a sample surface unit and the sample unit base.

In the ion milling device illustrated in FIG. 10, the rotating and tilting mechanism for the sample is provided with a rotating function while a tilting mechanism having a rotation tilt axis perpendicular to the axis of the ion beam is provided, as illustrated in FIG. 14. Further, a center displacing mechanism is provided for displacing the axis of the ion beam and the rotation axis of the sample-mask-unit slightly moving mechanism 4 from each other when the tilt angle is set at 90 degrees as shown in FIG. 14. Here, as shown in FIG. 15, a system using a shaft coupling may be employed. However, the shaft coupling, when used, needs to be placed in the rotating and tilting unit as shown in FIG. 15 while the center displacing mechanism needs to be placed in a lower portion of the rotor of the sample unit base 5. Having the function of rotating a sample and being configured to determine the incident angle and the amount of displacement of the center of the ion beam as shown in FIG. 14 and FIG. 15, the ion milling device is capable of also performing flat surface milling (smoothly processing a surface perpendicular to the axis of the ion beam (when the tilt angle of the sample stage is 90 degrees) while being the cross-section milling (device forming a smooth surface by milling a sample via a mask).

Note that since the distance between the ion source and the sample needs to be changed depending on the performance of the ion source for the cross-section milling and the flat surface milling, a mechanism capable of moving the ion source or the sample stage in the direction of the axis of the ion beam is provided. Therefore, the distance between the ion source and the sample is determined depending on the ion source when each of the cross-section milling and the flat surface milling is performed. For this reason, the device has a function of switching its mode between the cross-section milling mode and the flat surface milling mode (for example, rotation and tilt or rotation) by recognizing the cross-section milling or the flat surface milling from the position of the sample stage loaded with the sample or the position of the ion source.

Figure 19:
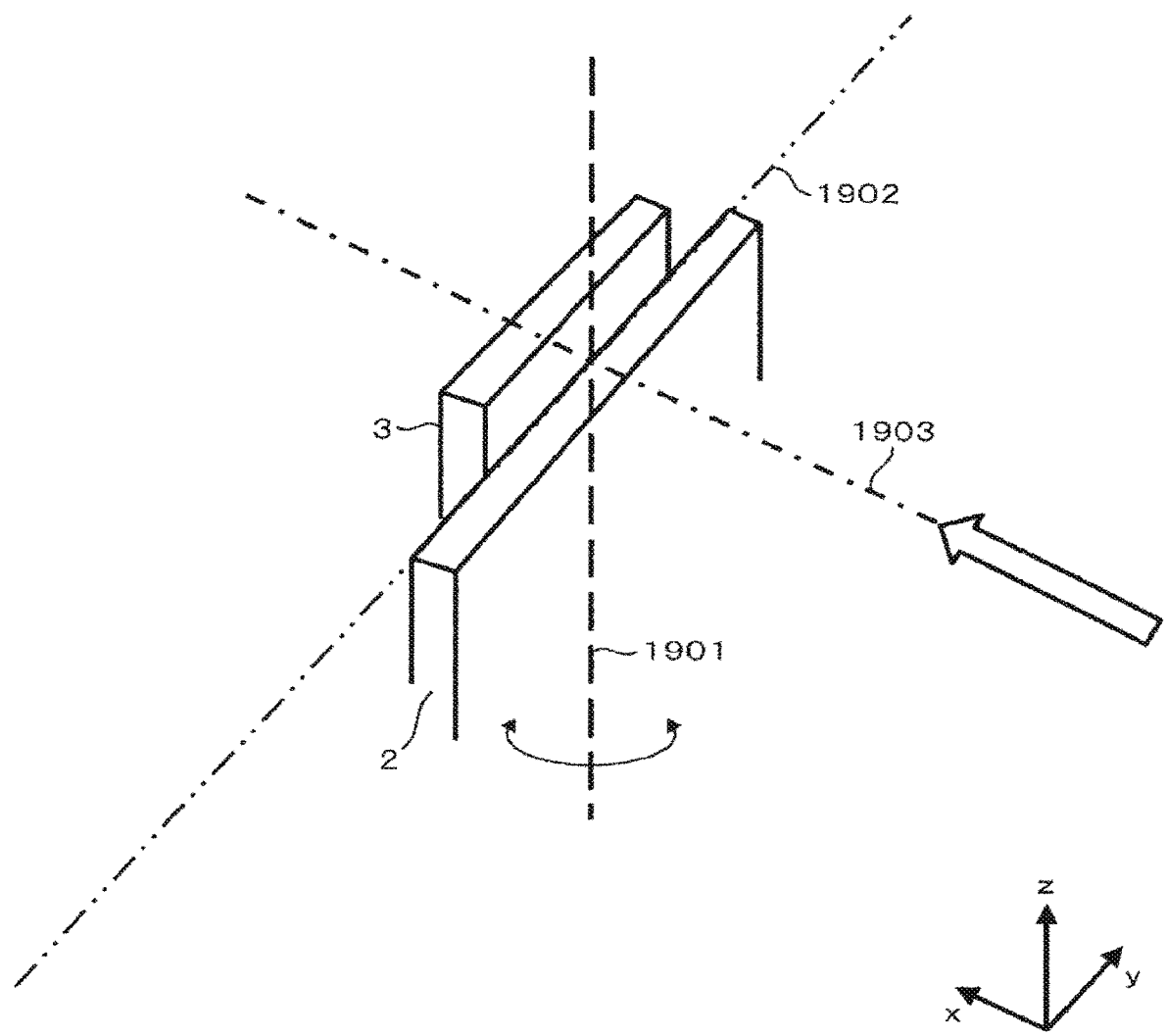
FIG. 19 is a view for explaining a relation between a line of the ion beam and the rotation tilt axis of the rotating and tilting mechanism during the cross-section milling.
Figure 20:
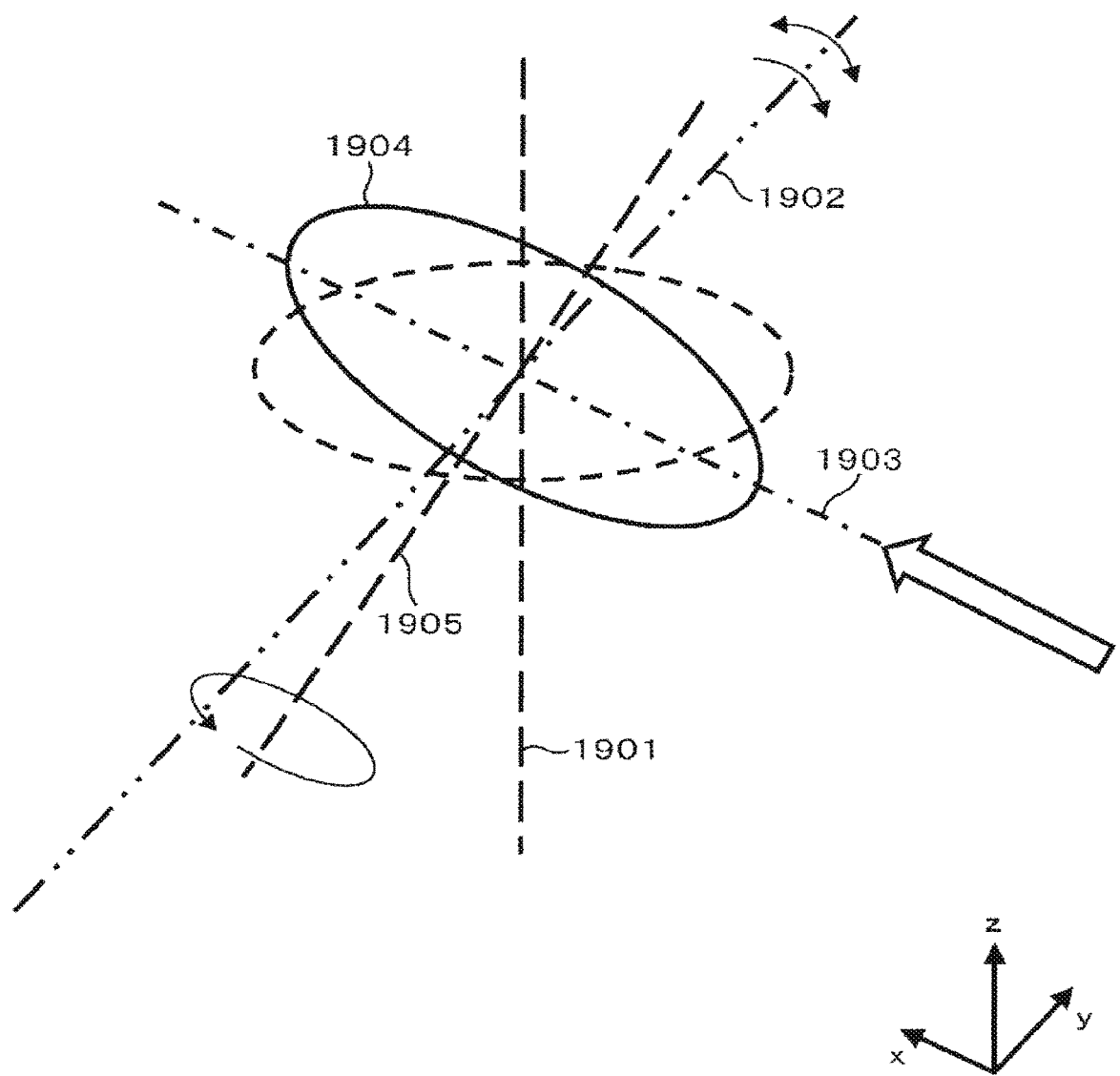
FIG. 20 is a view for explaining a relation between a line of the ion beam and the rotation tilt axis of the rotating and tilting mechanism during the flat surface milling.

Here, the reason why two different types of processing are made possible will be described further in detail. Hereinafter, the principle that enables the device illustrated in the embodiment to perform both of the cross-section milling processing and the flat surface milling processing will be described in detail. FIG. 19 is a view showing a relation between the irradiation direction of the ion beam and the rotation axis or tilt axis (hereinafter, simply referred to as the rotation axis) of each rotating mechanism or tilting mechanism (hereinafter, simply referred to as the rotating mechanism) in the cross-section milling. FIG. 20 is a view showing a relation between the irradiation direction of the ion beam and each rotation axis in the flat surface milling.

In FIG. 19, an axis 1901 represented by a dashed line is parallel with an axis represented by an alternate long and short dashed line in a diagram on the upper side of FIG. 10, and is also parallel with the rotation axis of the rotor 9 illustrated in FIG. 11, for example. Further, an axis 1902 represented by an alternate long and two short dashes line is parallel with the rotation axis of the sample stage 8. Moreover, an axis 1903 represented by an alternate long and short dashed line indicates the irradiation direction of the ion beam emitted from the ion source 1. In addition, the axis 1901 is parallel with a surface, irradiated with the ion beam, of the mask 2.

In addition, the axes 1901, 1902, and 1903 are orthogonal to one another. In the case of this example, the axis 1901, the axis 1902, and the axis 1903 are arranged in parallel with the z-axis, the y-axis, and the x-axis, respectively.

In the cross-section milling, a swing drive with the rotation axis parallel with the axis 1901 being set as a rotation center is performed so that a line should not be formed along the path of the ion beam on the cross section of the sample 3. At this time, the mask surface is parallel with the axis 1901. On the other hand, in the flat surface milling, as illustrated in FIG. 20, the sample 1904 is driven to tilt at a predetermined angle or swing within a predetermined angle range by the sample stage 8, and the sample 1904 is rotated about an axis parallel with a tilt axis 1905 of the axis 1901 set as the rotation axis.

As described above, the device of this embodiment is capable of rotation drive, or rotation drive about the tilt, or swing drive of a second rotation axis (the axis 1901 or the axis 1905 (including the case of performing swing operation) on the sample stage having a first rotation axis (axis parallel with the axis 1902). Specifically, the device illustrated in FIG. 10 is characterized in that the device performs the swing drive for the cross-section milling and the rotation or swing drive of the sample for the flat surface milling by using the rotating mechanism mounted on the sample stage 8 and performs the tilt for the flat surface milling by using the rotating mechanism which tilts the sample stage 8 itself. Note that the axis 1905 indicates the center of rotation of the drive mechanism in FIG. 20, but in the flat surface milling, rotation is performed with the center of the sample being displaced from the axis 1905 in order to perform the flat surface processing on a wide region of the sample.

Figure 21:
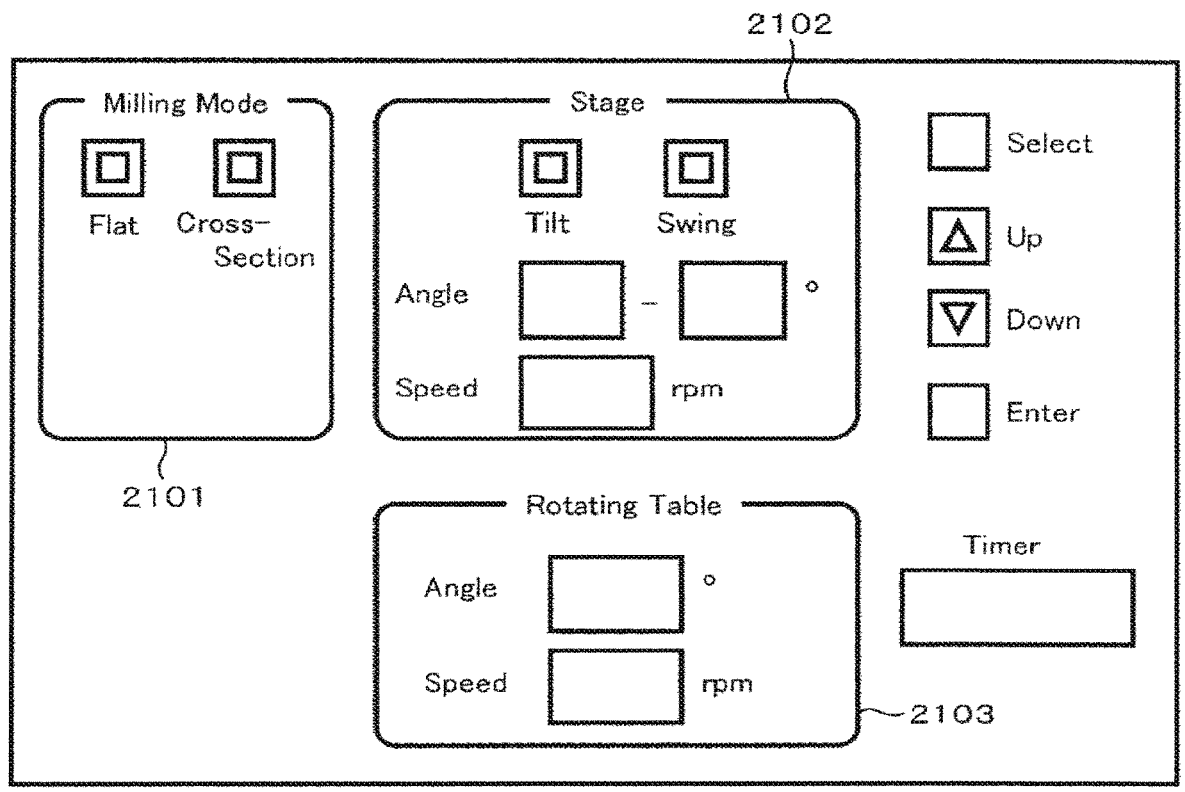
FIG. 21 is a view showing an overview of an operation panel of the ion milling device.

FIG. 21 is a view showing an example of an operation panel for switching the mode between the cross-section milling processing and the flat surface milling processing and for setting the operation conditions of the stage and the like. On a processing mode setting part 2101, buttons for selecting the flat surface milling (Flat) or the cross-section milling (Cross-section) are disposed, enabling alternative selection of either one of them. In addition, on a stage operation conditions setting part 2102, buttons for selecting tilt operation (Tilt) or swing operation (Swing) are disposed, enabling alternative selection of either one of them. The stage operation conditions setting part 2102 is further provided with setting parts for setting the tilt angle or the angle range of the swing operation (Angle) and the periodic speed (Speed) in the case of the swing operation. Further, a rotating table operation conditions setting part 2103 is provided with setting parts for setting the swing angle (Angle) and the periodic speed (Speed) of the swing operation by the rotating table.

In the operation panel illustrated in FIG. 21, selection of an input window is enabled by a select key (Select) and selection of a numerical value is enabled by "Up" and "Down" buttons, for the setting parts requiring input of a numerical value. Further, an enter key (Enter) allows a numerical value thus selected to be registered. The stage referred to here is, for example, the sample stage 8 in FIG. 10 while the rotating table referred to here is, for example, the rotor 9 in FIG. 11.

The cross-section milling processing requires the swing drive of the rotating table, but does not require the swing drive of the sample stage. For this reason, a control device of the milling device is preferably configured such that selecting the cross-section milling processing (selecting the Cross-section button) prohibits or invalidates setting in the stage operation conditions setting part 2102. On the other hand, tilting the sample stage 8 at the time of the cross-section milling may cause a portion irrelevant to the processing target to be irradiated with the ion beam or may cause the cross section of the sample to be processed obliquely. For this reason, with the cross-section milling processing being selected, if the sample stage 8 is in a tilt state, irradiation with the ion beam may be controlled to be not allowed or an error message may be generated to warn the operator. Alternatively, such a control that the tilt angle of the sample stage 8 is automatically set at zero may be employed.

On the other hand, the flat surface milling processing uses both of the tilting of the sample stage 8 and the rotation or swing of the rotating table, and thus, inputs of both of the stage operation conditions setting part 2102 and the rotating table operation conditions setting part 2103 need to be validated.

In the device of the embodiment, the rotor 9 is caused to perform both of the swing drive in the cross-section milling and the rotation drive in the flat surface milling, thereby making it possible to perform two different types of milling processing with the single milling device.

Note that, in the device illustrated in FIG. 10, the ion source 1 is disposed on a lateral side of the vacuum chamber 15. This is because this configuration makes it possible to stabilize the stage when the tilt stage is not tilted (for example, in the cross-section milling). Performing the cross-section processing with the tilt stage being not tilted requires irradiation with the ion beam from a lateral side, and accordingly, the ion source 1 is disposed on the lateral side of the vacuum chamber 15. In addition, in conjunction with this configuration, the processing observation window for checking the processed cross section is placed on the upper side of the vacuum chamber 15. Such configuration makes it possible to check the processed cross section in the cross-section milling and to check the processed surface in the flat surface milling through the single observation window.

Figure 22:
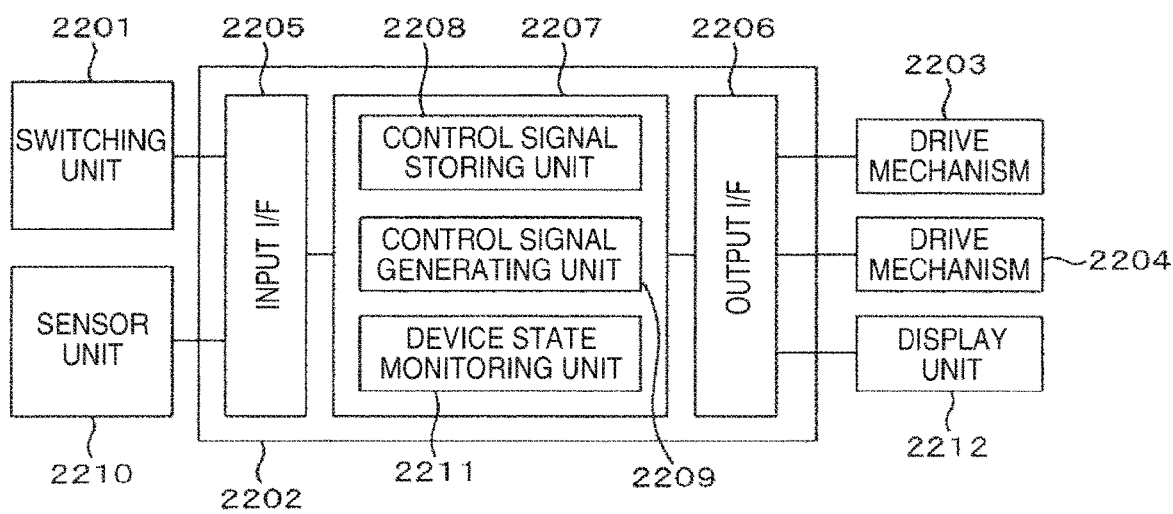
FIG. 22 is a view for explaining an overview of a control device of the ion milling device.

FIG. 22 is a view showing an example of a control device of the ion milling device illustrated in FIG. 10. A switching unit 2201 corresponds to the operation panel of FIG. 21, and information on selection made in the switching unit 2201 is transmitted to a calculating unit 2207 via an input interface 2205 provided in a control device 2202. In the calculating unit 2207, a control signal generating unit 2209 reads out a control signal from a control signal storing unit 2208 on the basis of an input signal, and transmits the control signal to an output interface 2206. Drive mechanisms 2203, 2204 perform drive under conditions selected in the switching unit 2201, on the basis of the received control signal.

The drive mechanism 2203 is a drive mechanism for driving the tilt stage and the drive mechanism 2204 is a drive mechanism for driving the rotating table mounted on the tilt stage. Note that, although in this embodiment, selection of which one of the cross-section milling processing and the flat surface milling processing is performed is made by selecting the processing mode in the switching unit 2201, the present invention is not limited to this configuration. For example, a sensor for recognizing the shape of the sample stage may be provided to automatically select the processing mode. In this case, the sensor and a calculating device for recognizing the sensor information correspond to the switching unit.

In addition, the device may be configured such that the selection of the processing mode in the switching unit and the state of the device are compared, and if the selection or the state of the device is not appropriate, an error message is generated to warn the operator not to perform processing based on the erroneous conditions.

Figure 23:
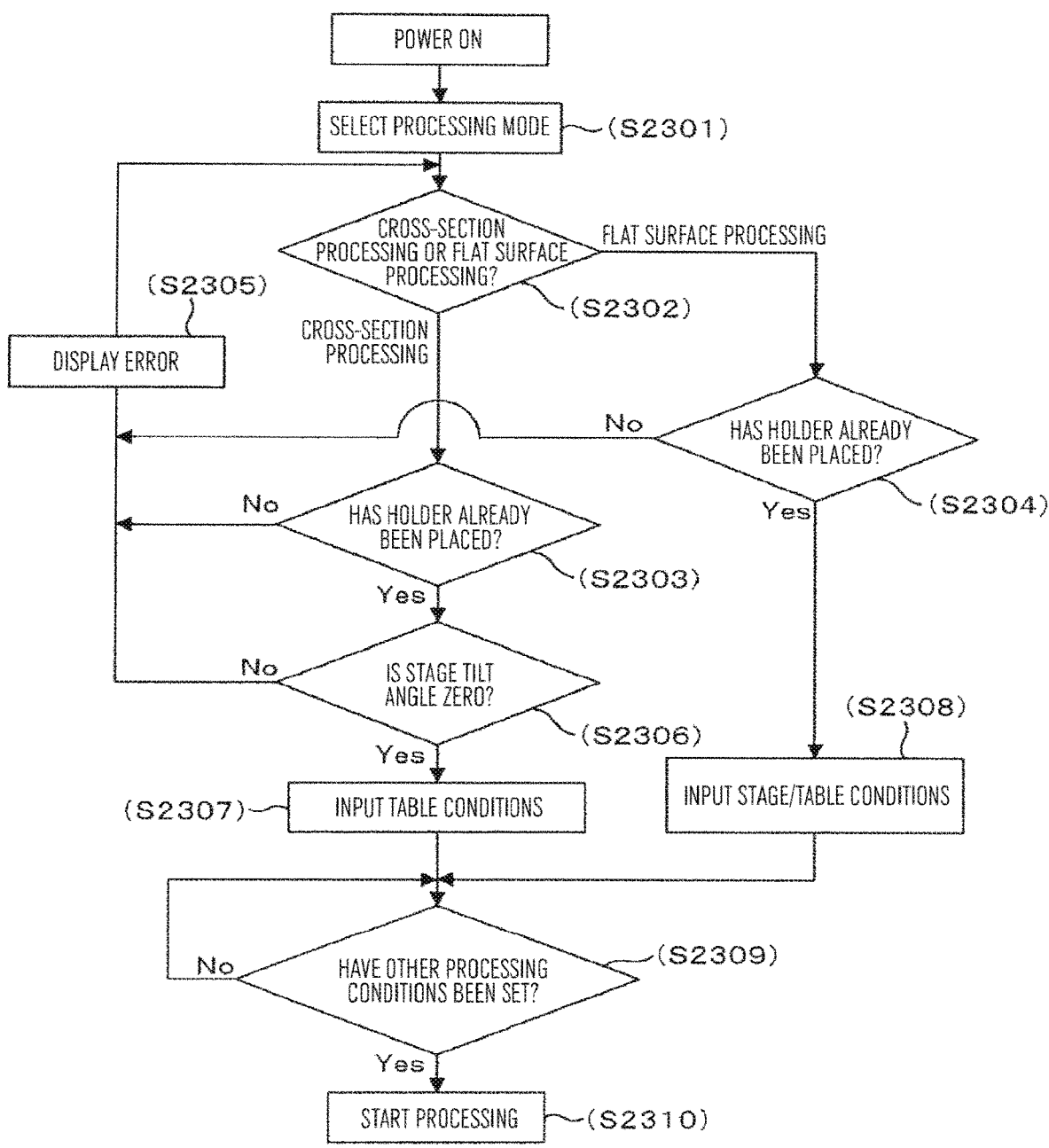
FIG. 23 is a flowchart showing a procedure of setting a processing mode and processing condition.

FIG. 23 is a flowchart showing a determination procedure of comparing the processing mode and the state of the device and of generating a message for leading the operator to perform correct device settings. First, the processing mode is selected on the operation panel as shown in FIG. 21 while the power of the device is on (Step 2301). Then, the control signal generating unit 2209 of the calculating unit 2207 determines which processing mode is selected (Step 2302), and determines whether or not a sample holder suitable for the processing mode has been placed on the sample stage (the determination is made at Step 2303 when the cross-section processing is selected or at Step 2304 when the flat surface processing is selected).

The determination on whether or not a predetermined sample holder has been placed is implemented by including in the vacuum chamber a sensor (sensor unit 2210) for determining the difference between the sample holders and whether or not the sample holder has been placed. When the sensor generates a signal indicating that the sample holder itself has not been placed or indicating that a sample holder unsuitable for the set processing mode has been placed, a device state monitoring unit 2211 incorporated in the calculating unit 2207 transmits a predetermined signal to a display unit 2212, which thus generates an error message (Step 2305). The error message may be made as "Err" displayed on the display unit of the operation panel illustrated in FIG. 21, or may be displayed by using another display means or warning generator.

Next, when the cross-section milling is selected at Step 2302, it is determined whether or not the tilt angle of the sample stage 8 is zero (Step 2306). When the tilt angle is not zero, an error message is generated. The generation of such message makes it possible to notice that the state of the stage is not appropriately set for the cross-section milling and thus suppresses the possibility of performing erroneous processing. After the tilt angle of the stage is confirmed to be appropriately set at Step 2307, the determination procedure proceeds to a state enabling the conditions for the swing drive of the rotating table to be inputted (Step 2307).

On the other hand, when the flat surface milling is selected at Step 2302, the determination process proceeds to a state enabling the conditions for both of the tilt stage and the rotating stage to be set (Step 2308) because of the necessity to drive both stages.

After the above-described procedure, it is further determined whether or not the other conditions to be set (current of the ion beam, processing time, and the like) are set (Step 2309), and the processing is started (Step 2310).

Performing the processing after the above-described procedure eliminates occurrence of wrong selection in the device capable of performing two types of processing, and allows easy setting of the processing conditions. Moreover, when the stage is tilted (if the tilt angle is not 0°) at Step 2306, the tilt stage may be controlled to fall automatically into a non-tilt state.

As described above, finding the setting information of the processing mode, the type of the mounted holder, and the state of the device as well as comparing these pieces of information makes it possible to easily determine whether or not the current setting state is appropriate, and to thus prevent processing based on erroneous settings from occurring.

In addition, as described above, the distance between the ion source and the sample needs to be changed depending on the performance of the ion source for the cross-section milling and the flat surface milling. For this reason, the device may be configured such that the processing mode is automatically switched depending on the setting of the position of the sample stage. Moreover, the device may be configured such that an error message is generated when the setting of the position of the sample stage and the selection of the processing mode conflict with each other. In this case as well, performing the setting after the procedure as illustrated in FIG. 23 makes it possible to prevent erroneous settings. Further, the device may be provided with a control mechanism that automatically controls the position of the sample stage depending on the selection of the processing mode.

Since the sample-mask-unit slightly moving mechanism 4 on which the sample-mask unit 21 is mounted is detachable from the device body, a sample surface unit can be attached to the device after the sample-mask-unit slightly moving mechanism 4 is removed from the device. Performing the flat surface milling with the sample surface unit being placed minimizes the milling processing other than the sample and almost eliminates damaging of the sample unit.

Figure 17:
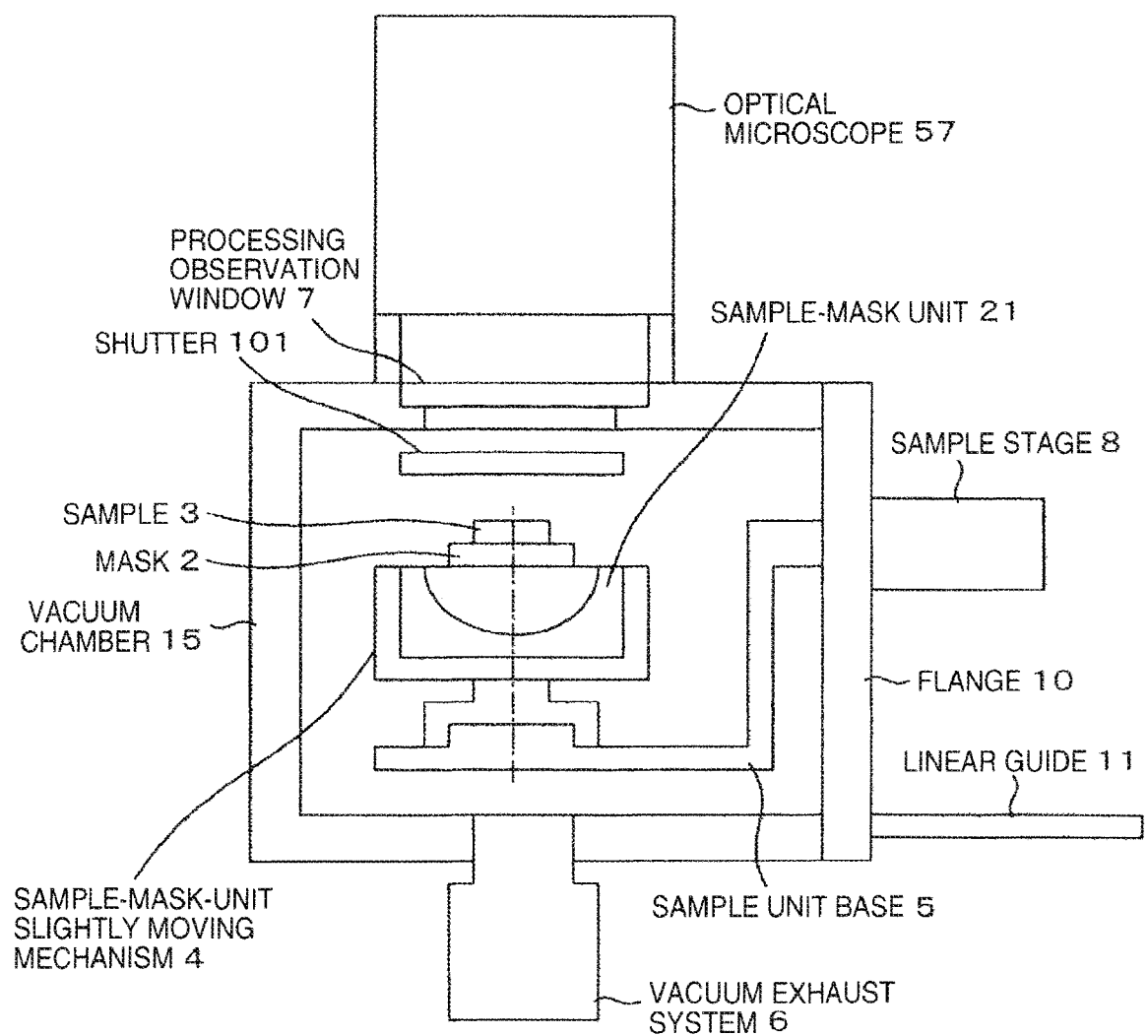
FIG. 17 is a schematic configuration view of an ion milling device on which an optical microscope is mounted.

Moreover, placing an optical microscope 57, as in FIG. 17, on the upper portion of the processing observation window of the ion milling device illustrated in FIG. 10 and the like allows the progress of the milling processing to be checked. This makes it possible terminate the processing and to take out the sample when the processing is completed up to a desired processing range, and thereby contributes to an improvement in throughput.

Figure 18:
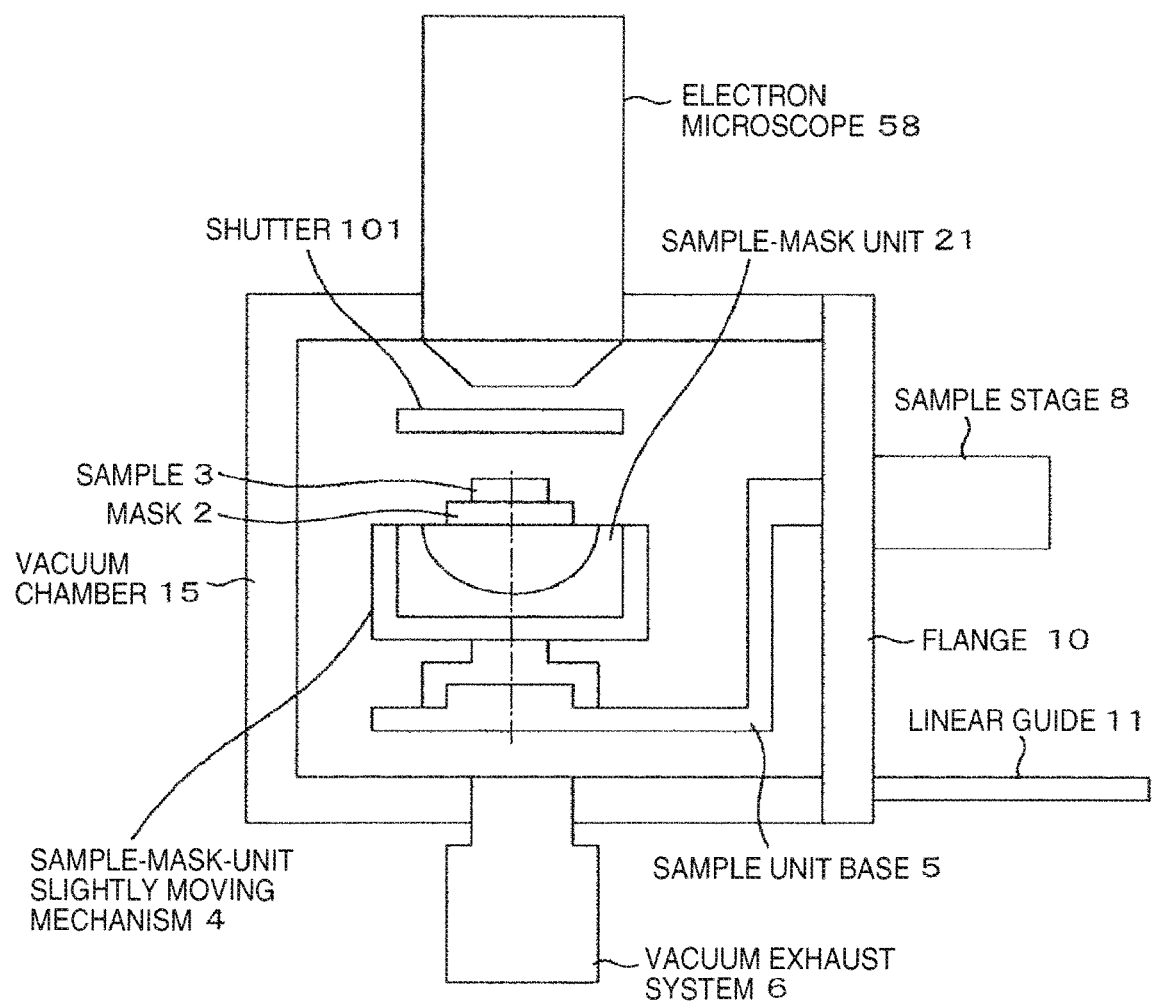
FIG. 18 is a schematic configuration view of the ion milling device on which an electron microscope is mounted.

Furthermore, an electron microscope 58 may be placed as illustrated in FIG. 18 in place of the optical microscope 57 illustrated in FIG. 17. The electron microscope 58 is used for checking the progress of the processing during performing the milling processing on the sample with the ion beam. The method of using the electron microscope 58 is to temporarily stop the milling processing, open the shutter for contamination prevention, and then perform observation using the electron microscope 58. When a desired processing range has not been obtained yet, the electron beam irradiation is terminated, the shutter for contamination prevention is closed, and then, the milling processing is started again by irradiation with the ion beam. When a desired processing range has been obtained, the magnification is increased to a required level and a required image is captured.

The device is configured such that sample-mask-unit slightly moving mechanism 4 or the sample surface unit is removed from the device, the sample is mounted on a sample unit for the electron microscope, and then, the sample unit is attached to the device. In this way, the device can be used as a normal electron microscope as well.

According to the ion milling device illustrated in the embodiment, it is possible to obtain an ion milling device in which the processing observation window 7, the ion source 1, and the sample stage 8 are placed on the upper surface, the left side surface (or the right side surface), and the front surface of the vacuum chamber 15, respectively. This facilitates both of the placement and the observation of the processed surface observation device. Furthermore, this makes it possible to perform both of the cross-section milling and the flat surface milling with the single device.

Recently, it has increasingly become important to perform the cross-sectional observation on a composite material with an electron microscope, particularly in the field of semiconductor devices. Along with this, an increasing importance is placed on the mirror-polishing of a cross section of a composite material. This embodiment makes it possible to perform both of the cross-section milling and the flat surface milling with a single device. Furthermore, placing an observation device on an upper portion of a vacuum chamber significantly improves the operability.

Although the above description has been made regarding the embodiments, the present invention is not limited to these embodiments, and it is apparent to those skilled in the art that various changes and modifications may be made within the spirit of the present invention and the scope of the attached claims.

REFERENCE SIGNS LIST

1 ion source
2 mask
3 sample
4 sample-mask-unit slightly moving mechanism
5 sample unit base
6 vacuum exhaust system
7 processing observation window
8 sample stage
9 rotor
10 flange
11, 24 linear guide
12 magnifying lens
13 magnifying-lens slightly moving mechanism
15 vacuum chamber
21 sample-mask unit
22 sample-holder rotary ring
23 sample holder
25 mask holder
26 mask finely adjusting mechanism
27 mask fixing screw
28 sample-holder rotary screw
30 sample-holder-position controlling mechanism
35 sample-holder fixing metal fitting
40, 57 optical microscope
41 observation table
42 fixation table
50 gear
51 bearing
52 mask unit fixation part
53 shaft coupling
54 linear motion device
55 motor
56 sample surface unit
58 electron microscope
60 sample-stage pulling out mechanism

The invention claimed is:

1. An ion milling device including:
   a vacuum chamber;
   an ion source for emitting an ion beam;
   a tilt stage disposed inside the vacuum chamber and having a tilt axis parallel with a first axis orthogonal to the ion beam;
   a support table disposed on the tilt stage;
   a sample holding member attached to the support table such that a surface of the sample is parallel with the support table, the sample holding member holds the sample to perform a surface milling to process the surface of the sample, and the sample holding member is further attached such that the surface of the sample is perpendicular to the support table when a cross section milling to process an edge of the sample is performed;
   a mask for shielding a portion of the sample, the mask connected to a mask holder, the mask holder having an edge extending in a direction toward the sample holding member and away from a mask adjusting mechanism, and the mask extends past the edge of the mask holder;
   a mask adjusting mechanism for moving the position of the sample and the mask;
   a flange attached to the vacuum chamber and connecting the sample holding member and the mask, such that when the flange is moved along a linear guide the sample holding member and the mask are integrally removed from the vacuum chamber; and
   a drive mechanism for rotating or swinging the support table with respect to a rotation axis which is parallel with a second axis orthogonal to the first axis and is parallel with a normal direction of a sample placing surface of the support table,
   wherein in the surface milling, the ion beam is irradiated while the tilt stage is tilted with respect to the ion beam and the support table is rotated or swung with respect to the rotation axis, with the surface of the sample being parallel with the support table; and in the cross section milling, the ion beam is irradiated while the tilt stage is not tilted with respect to the ion beam and the support table is swung with respect to the rotation axis, with a surface of the sample being perpendicular to the support table, wherein the support table and sample holding member are provided on a sample unit base, a first surface of the support table is in contact with the sample unit base, and the sample unit base does not rotate, and wherein the rotation axis and the surface of the sample are positioned at an equal height.

2. The ion milling device according to claim 1, further comprising a unit for determining, by a sensor, which one of the first sample holding member or a second sample holding member is attached to the support table.

3. The ion milling device according to claim 2, further comprising:
   a unit for switching, based on a determination result by the sensor, the performing the surface milling and the performing the cross section milling.

4. The ion milling device according to claim 1, further comprising:
   a unit for switching, through an operation of a control device, the performing the surface milling and the performing the cross section milling.

5. The ion milling device according to claim 4, wherein the switching is performed depending on a distance between the ion source and the sample.

6. The ion milling device according to claim 1, further comprising:
   a mechanism for displacing a center of a position of the sample on the support table.

7. The ion milling device according to claim 1, further comprising:
   a mechanism for displacing an axis of the ion beam and the rotation axis of the support table from each other.

8. The ion milling device according to claim 1, further comprising:
   a part for partially blocking the ion beam in the cross section milling.

9. The ion milling device according to claim 1, wherein the vacuum chamber is provided with an observation window.

10. The ion milling device according to claim 9, wherein the observation window is provided in a ceiling surface of the vacuum chamber.

11. The ion milling device according to claim 10, wherein the ion source is placed in a surface different from the ceiling surface of the vacuum chamber.

12. The ion milling device according to claim 11, wherein a shutter movable to a space between an ion beam irradiation position for the sample and the observation window is provided.

13. The ion milling device according to claim 1, wherein the vacuum chamber is provided with an optical microscope or electron microscope.

14. The ion milling device according to claim 13, wherein the optical microscope or electron microscope is provided in a ceiling surface of the vacuum chamber.

15. The ion milling device according to claim 14, wherein the ion source is placed in a surface different from the ceiling surface of the vacuum chamber.

16. The ion milling device according to claim 1, comprising:
   the sample holding member including a first sample holding member and a second sample holding member, each of the first and second sample holding members being configured to be attachable to and detachable from the support table, wherein:
   the surface milling is performed on the surface of the sample held by the first sample holding member attached to the support table such that a surface of the sample is parallel with the support table, and
   the cross section milling is performed on the edge of the sample held by the second sample holding member attached to the support table such that the surface of the sample is perpendicular to the support table.

17. The ion milling device according to claim 1, wherein the ion milling device is configured such that the cross section milling to the sample is performed before the surface milling to the sample.

* * * * *